(12) United States Patent
Zhang et al.

(10) Patent No.: US 10,148,961 B2
(45) Date of Patent: Dec. 4, 2018

(54) ARITHMETIC CODER WITH MULTIPLE WINDOW SIZES

(71) Applicant: QUALCOMM Incorporated, San Diego, CA (US)

(72) Inventors: Li Zhang, San Diego, CA (US); Jianle Chen, San Diego, CA (US); Xin Zhao, San Diego, CA (US); Xiang Li, San Diego, CA (US); Hongbin Liu, Beijing (CN); Ying Chen, San Diego, CA (US); Marta Karczewicz, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 196 days.

(21) Appl. No.: 15/166,044

(22) Filed: May 26, 2016

(65) Prior Publication Data
US 2016/0353110 A1     Dec. 1, 2016

Related U.S. Application Data

(60) Provisional application No. 62/168,503, filed on May 29, 2015.

(51) Int. Cl.
*H04N 19/13*    (2014.01)
*H04N 19/174*   (2014.01)
(Continued)

(52) U.S. Cl.
CPC .......... *H04N 19/13* (2014.11); *H03M 7/4018* (2013.01); *H03M 7/6011* (2013.01);
(Continued)

(58) Field of Classification Search
CPC ....................................................... H04N 19/13
(Continued)

(56) References Cited

U.S. PATENT DOCUMENTS 9,130,585 B2 *   9/2015  Marpe ................. H03M 7/4081
9,521,433 B2 * 12/2016  Chono ................. H04N 19/196
(Continued)

FOREIGN PATENT DOCUMENTS

EP    1515446 A1    3/2005
EP    2760201 A2    7/2014
(Continued)

OTHER PUBLICATIONS

Response to Invitation to Pay Additional Fees dated Aug. 19, 2016, from International Application No. PCT/US2016/034647, filed on Sep. 16, 2016, 3 pp.
(Continued)

*Primary Examiner* — Leron Beck
(74) *Attorney, Agent, or Firm* — Shumaker & Sieffert, P.A.

(57) ABSTRACT

An example method of entropy coding video data includes determining a window size of a plurality of window sizes for a context of a plurality of contexts used in a context-adaptive coding process to entropy code a value for a syntax element of the video data; entropy coding, based on a probability state of the context, a bin of the value for the syntax element; updating a probability state of the context based on the window size and the coded bin. The example method also includes entropy coding a next bin with the same context based on the updated probability state of the context.

29 Claims, 12 Drawing Sheets

(51) Int. Cl.

| | |
|---|---|
| *H04N 19/159* | (2014.01) |
| *H04N 19/42* | (2014.01) |
| *H04N 19/70* | (2014.01) |
| *H04N 19/126* | (2014.01) |
| *H04N 19/139* | (2014.01) |
| *H03M 7/40* | (2006.01) |
| *H04N 19/46* | (2014.01) |
| *H04N 19/91* | (2014.01) |
| *H04N 19/146* | (2014.01) |
| *H04N 19/184* | (2014.01) |
| *H03M 7/30* | (2006.01) |

(52) U.S. Cl.
   CPC ......... *H04N 19/126* (2014.11); *H04N 19/139* (2014.11); *H04N 19/146* (2014.11); *H04N 19/159* (2014.11); *H04N 19/174* (2014.11); *H04N 19/184* (2014.11); *H04N 19/42* (2014.11); *H04N 19/46* (2014.11); *H04N 19/70* (2014.11); *H04N 19/91* (2014.11)

(58) Field of Classification Search
   USPC ........................................ 375/240.01–240.29
   See application file for complete search history.

(56) References Cited

U.S. PATENT DOCUMENTS

| | | | | |
|---|---|---|---|---|
| 2005/0123207 A1* | 6/2005 | Marpe | ................... | H04N 19/196 382/239 |
| 2005/0169374 A1* | 8/2005 | Marpe | ................... | H04N 19/176 375/240.16 |
| 2006/0193388 A1* | 8/2006 | Woods | ................. | H04N 19/647 375/240.16 |
| 2007/0025441 A1* | 2/2007 | Ugur | .................... | H04N 19/159 375/240.03 |
| 2012/0081241 A1* | 4/2012 | Misra | ................... | H03M 7/4093 341/107 |
| 2012/0300839 A1* | 11/2012 | Sze | ......................... | H04N 19/91 375/240.12 |
| 2013/0107951 A1* | 5/2013 | Sole Rojals | ........... | H04N 19/13 375/240.12 |
| 2016/0007046 A1* | 1/2016 | Chou | ..................... | H04N 19/13 375/240.02 |
| 2016/0353108 A1 | 12/2016 | Zhang | | |
| 2017/0339413 A1* | 11/2017 | Alshin | ................. | H04N 19/149 |

FOREIGN PATENT DOCUMENTS

| | | | |
|---|---|---|---|
| EP | 2770736 A1 | 8/2014 | |
| WO | 2013067186 A1 | 5/2013 | |

OTHER PUBLICATIONS

Response to Written Opinion dated Nov. 7, 2016, from International Application No. PCT/US2016/034647, filed on Mar. 10, 2017, 6 pp.
Second Written Opinion from International Application No. PCT/US2016/034647, dated May 22, 2017, 11 pp.
International Preliminary Report on Patentability from International Application No. PCT/US2016/034647, dated Aug. 21, 2017, 14 pp.
Alshin A., et al., "CE1 (subset C, test 11): Multi-Parameter Probability Up-date for PIPE", 7. JCT-VC Meeting; 98. MPEG Meeting; Nov. 21 through 30, 2011; Geneva, CH; (Joint Collaborative Team on Video Coding of ISO/IEC JTC1/SC29/WG11 and ITU-T SG.16 ); URL: http://wftp3.itu.int/av-arch/jctvc-site/ No. JCTVC-G771, Nov. 9, 2011, XP030110755, 5 pp.
Alshin, et al., "Multi-parameter probability up-date for CABAC," 6th Meeting: Torino, IT, Jul. 14-22, 2011, Joint Collaborative Team on Video Coding (JCT-VC) of ITU-T SG16 WP3 and ISO/IEC JTC1/SC29/WG11; JCTVC-F254_v5, Jul. 12, 2011, 5 pp.
Alshina E., et al., "CE1; subtest C4: Multi-parameter Probability Estimation for CABAC", 99. MPEG meeting, Feb. 1 through 10, 2012, San Jose, CA; (Motion Picture Expert Group or ISO/IEC JTC1/SC29/WG11), No. m22984, Feb. 1, 2012, XP030051509, 5 pp.
Belyaev E., et al., "Binary Arithmetic Coding System with Adaptive Probability Estimation by Virtual Sliding Window", 2006 IEEE Tenth International Symposium, IEEE, Jun. 28, 2006, XP010936892, DOI: 10.1109/ISCE.2006.1689517, ISBN: 978-1-4244-0216-8, 5 pp.
Chen J., et al., "Further Improvements to HMKTA-1.0", 52. VCEG meeting, Jun. 19 through 26, 2015, Warsaw, PL (Video Coding Experts Group of ITU-T SG.16), No. VCEG-AZ07, Jun. 19, 2015, XP030003885, 8 pp.
Guo L. et al., "CE1 B3: 8-bit Linear Initialization for CABAC", 8. JCT-VC Meeting; 99. MPEG Meeting; Feb. 1 through 10, 2012; San Jose, USA; (Joint Collaborative Team on Video Coding of ISO/IEC JTC1/SC29/WG11 and ITU-T SG.16); URL: http://wftp3.itu.int/av-arch/jctvc-site/, No. JCTVC-H0535, Jan. 21, 2012, XP030111562, 7 pp.
International Search Report and Written Opinion for International Application No. PCT/US2016/034647, dated Nov. 7, 2016, 24 pp.
ITU-T H.265, Series H: Audiovisual and Multimedia Systems, Infrastructure of audiovisual services—Coding of moving video, Advanced video coding for generic audiovisual services, The International Telecommunication Union. Apr. 2015, 634 pp.
Marpe D., et al., "Context-based adaptive binary arithmetic coding in the H.264/AVC video compression standard", IEEE Transactions on Circuits and Systems for Video Technology, IEEE Service Center, XP011099255, vol. 13(7), Jul. 2003, 17 pp.
Partial International Search Report for International Application No. PCT/US2016/034647, dated Aug. 19, 2016, 11 pp.
Yeo C., et al., "Non-CE1: On CABAC context initialization," 7th Meeting: Geneva, CH, Nov. 21 through 30, 2011, Geneva, CH; (Joint Collaborative Team on Video Coding (JCT-VC) of ITU-T SG16 WP3 and ISO/IEC JTC1/SC29/WG11), JCTVC-G155, May 10, 2015, 13 pp.
Wang et al., "High Efficienct Video Coding (HEVC) Defect Report," 14th Meeting, Jul. 25 through Aug. 2, 2013, Vienna, AT; (Joint Collaborative Team on Video Coding (JCT-VC) of ITU-T SG16 WP3 and ISO/IEC JTC1/SC29/WG11), JCTVC-N1003_v1, Sep. 27, 2013, 312 pp.
Alshin et al., "CE1(subset B): Multi-parameter probability up-date for CABAC," 7th Meeting, Nov. 21 through 30, 2011, Geneva, CH; (Joint Collaborative Team on Video Coding (JCT-VC) of ITU-T SG16 WP3 and ISO/IEC JCT1/SC29/WG11), JCTVC-G764, Nov. 9, 2011, 4 pp.
Sze et al., "High Throughput CABAC Entropy Coding in HEVC", IEE Transactions on Circuits and Systems for Video Technology, vol. 22, No. 12, Dec. 2012, 14 pp.
Bross et al., "High efficiency video coding (HEVC) text specification draft 10 (for FDIS & Last Call)," 12th Meeting: Geneva, CH, Jan. 14-23, 2013, (Joint Collaborative Team on Video Coding of ISO/IEC JTC1/SC29/WG11 and ITU-T SG.16); JCTVC-L1003_v34, Mar. 19, 2013, 310 pp.
Marpe et al., "Transform Coding Using the Residual Quadtree (RQT)", Fraunhofer Heinrich Hertz Institute, URL: http://www.hhi.fraunhofer.de/fields-of-competence/image-processing/researchgroups/image-video-coding/hevc-high-efficiency-video-coding/transform-coding-using-the-residual-quadtree-rqt.html; retrieved [Feb. 9, 2017], 4 pp.
Alishina et al., "JCTVC-254 Multi-parameter probability up-date for CABAC", 6, JCT-VC Meeting, 97, MPEG Meeting, Jul. 14 through 22, 2011, Torino, IT; (Joint Collaborative Team on Video Coding of ISO/IEC JTC1/SC29/WG11 and ITU-T SG.16); URL: http://wftp3.1tu.int/av-arch/jctvc-site/, No. JCTVC-F254 pp, Jul. 2, 2011, 7 pp.

* cited by examiner

ARITHMETIC CODER WITH MULTIPLE WINDOW SIZES

This application claims the benefit of U.S. Provisional Application No. 62/168,503 filed May 29, 2015, the entire content of which is incorporated herein by reference.

TECHNICAL FIELD

This disclosure relates to video coding and, more particularly, to techniques for binary arithmetic coding of video data.

BACKGROUND

Digital video capabilities can be incorporated into a wide range of devices, including digital televisions, digital direct broadcast systems, wireless broadcast systems, personal digital assistants (PDAs), laptop or desktop computers, digital cameras, digital recording devices, digital media players, video gaming devices, video game consoles, cellular or satellite radio telephones, video teleconferencing devices, and the like. Digital video devices implement video compression techniques, such as those described in the standards defined by MPEG-2, MPEG-4, ITU-T H.263, ITU-T H.264/MPEG-4, Part 10, Advanced Video Coding (AVC), the High Efficiency Video Coding (HEVC) standard, and extensions of such standards, to transmit, receive and store digital video information more efficiently.

Video compression techniques include spatial prediction and/or temporal prediction to reduce or remove redundancy inherent in video sequences. For block-based video coding, a video frame or slice may be partitioned into blocks. Each block can be further partitioned. Blocks in an intra-coded (I) frame or slice are encoded using spatial prediction with respect to reference samples in neighboring blocks in the same frame or slice. Blocks in an inter-coded (P or B) frame or slice may use spatial prediction with respect to reference samples in neighboring blocks in the same frame or slice or temporal prediction with respect to reference samples in other reference frames. Spatial or temporal prediction results in a predictive block for a block to be coded. Residual data represents pixel differences between the original block to be coded and the predictive block.

An inter-coded block is encoded according to a motion vector that points to a block of reference samples forming the predictive block, and the residual data indicating the difference between the coded block and the predictive block. An intra-coded block is encoded according to an intra-coding mode and the residual data. For further compression, the residual data may be transformed from the pixel domain to a transform domain, resulting in residual transform coefficients, which then may be quantized. The quantized transform coefficients, initially arranged in a two-dimensional array, may be scanned in a particular order to produce a one-dimensional vector of transform coefficients for entropy coding.

Various entropy coding processes may utilized to code residual transform coefficients, motion vector information, syntax elements, and other associated information. Examples of various entropy coding and other data compression processes include context-adaptive variable length coding (CAVLC), context-adaptive binary arithmetic coding (CABAC), probability interval partitioning entropy coding (PIPE), Golomb coding, Golomb-Rice coding, and exponential Golomb coding.

SUMMARY

In general, this disclosure describes techniques for performing video coding. More particularly, this disclosure describes example techniques for performing context-based entropy coding with different window sizes. In some examples, the techniques described in this disclosure may enable performance of CABAC with different window sizes. In other examples, the techniques described in this disclosure may be applied to other entropy coders which use contexts for coding symbols, such as context-based variable length coding.

In one example, a method for entropy coding of video data includes determining a window size of a plurality of window sizes for a context of a plurality of contexts used in a context-adaptive entropy coding process (e.g., a CABAC or CAVLC process) to entropy code a value for a syntax element. In this example, the method also includes entropy coding a bin of the value for the syntax element, and updating a probability state of the context based on the window size and the coded bin. In this example, the method also includes entropy coding the next bin with the same context based on the updated probability state of the context.

In another example, an apparatus for entropy coding of video data includes one or more processors and a memory configured to store a plurality of contexts used in a context-adaptive entropy coding process to entropy code a value for a syntax element of the video data. In this example, the one or more processors are configured to determine a window size for a context of the plurality of contexts. In this example, the one or more processors are further configured to entropy code a bin of the value for the syntax element based on a probability state of the context, update the probability state of the context based on the window size and the coded bin; and code, based on the updated probability state of the context, the next bin with the same context based on the updated probability state of the context.

In another example, an apparatus for entropy coding of video data includes means for determining a window size of a plurality of window sizes for a context of a plurality of contexts used in a context-adaptive coding process to entropy code a value for a syntax element of the video data; means for entropy coding, based on a probability state of the context, a bin of the value for the syntax element; means for updating the probability state of the context model based on the window size and the coded bin. In this example, the apparatus also includes means for entropy coding a next bin with the same context based on the updated probability state of the context model.

In another example, a computer-readable storage medium stores instructions that, when executed, cause one or more processors of a video coding device to determine a window size of a plurality of window sizes for a context of a plurality of contexts used in a context-adaptive coding process to entropy code a value for a syntax element of the video data; entropy code, based on a probability state of the context, a bin of the value for the syntax element; update the probability state of the context based on the window size and the coded bin; and entropy code a next bin with the same context based on the updated probability state of the context model.

In another example, a computer-readable storage medium stores video data that, when processed by a video decoding device, cause one or more processors of the video decoding device to determine a window size of a plurality of window sizes for a context of a plurality of contexts used in a context-adaptive coding process to entropy code a value for a syntax element; entropy code, based on a probability state of the context, a bin of the value for the syntax element; update the probability state of the context based on the window size and the coded bin; and entropy code a next bin with the same context based on the updated probability state of the context model.

The details of one or more aspects of the disclosure are set forth in the accompanying drawings and the description below. Other features, objects, and advantages of the techniques described in this disclosure will be apparent from the description and drawings, and from the claims.

DETAILED DESCRIPTION

The techniques of this disclosure are generally related to an entropy coding module in block-based hybrid video coding. These techniques may be applied to any existing video codecs, such as HEVC (High Efficiency Video Coding) or these techniques may be an efficient coding tool in any future video coding standards or other proprietary or non-proprietary coding techniques. For purposes of example and explanation, the techniques of this disclosure are generally described with respect to HEVC (or ITU-T H.265) and/or ITU-T H.264. Additionally, for purposes of example and explanation, the techniques of this disclosure are generally described with respect to CABAC coders, although it is understood that the techniques of this disclosure may be applicable to other context-based entropy coders, such as context-adaptive variable-length coders.

Figure 1:
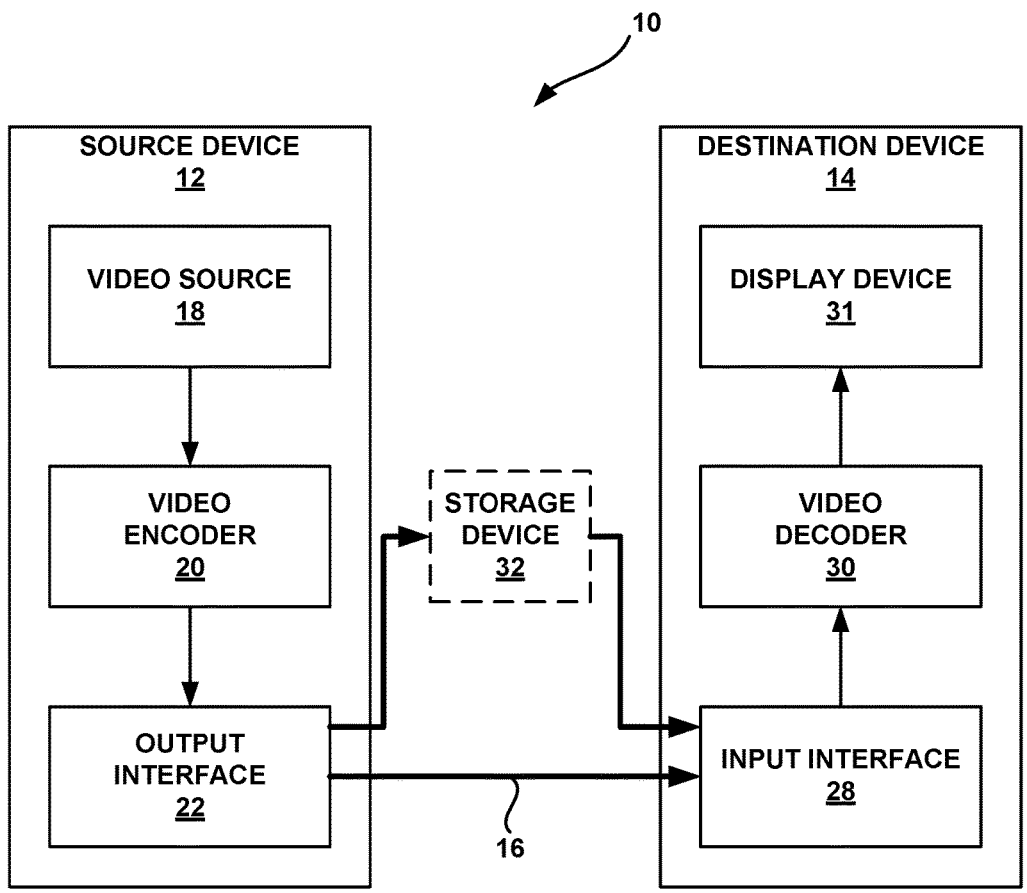
FIG. 1 is a block diagram illustrating an example video encoding and decoding system.

FIG. 1 is a block diagram illustrating an example video encoding and decoding system 10 that may utilize techniques for coding data according to a CABAC design with variable window sizes. As shown in FIG. 1, system 10 includes a source device 12 that provides encoded video data to be decoded at a later time by a destination device 14. In particular, source device 12 provides the video data to destination device 14 via a computer-readable medium 16.

Source device 12 and destination device 14 may comprise any of a wide range of devices, including desktop computers, notebook (i.e., laptop) computers, tablet computers, set-top boxes, telephone handsets such as so-called "smart" phones, so-called "smart" pads, televisions, cameras, display devices, digital media players, video gaming consoles, video streaming device, or the like. In some cases, source device 12 and destination device 14 may be equipped for wireless communication.

Destination device 14 may receive the encoded video data to be decoded via computer-readable medium 16. Computer-readable medium 16 may comprise any type of medium or device capable of moving the encoded video data from source device 12 to destination device 14. In one example, computer-readable medium 16 may comprise a communication medium to enable source device 12 to transmit encoded video data directly to destination device 14 in real-time. The encoded video data may be modulated according to a communication standard, such as a wireless communication protocol, and transmitted to destination device 14. The communication medium may comprise any wireless or wired communication medium, such as a radio frequency (RF) spectrum or one or more physical transmission lines. The communication medium may form part of a packet-based network, such as a local area network, a wide-area network, or a global network such as the Internet. The communication medium may include routers, switches, base stations, or any other equipment that may be useful to facilitate communication from source device 12 to destination device 14.

In some examples, encoded data may be output from output interface 22 to a storage device. Similarly, encoded data may be accessed from the storage device by input interface. The storage device may include any of a variety of distributed or locally accessed data storage media such as a hard drive, Blu-ray discs, DVDs, CD-ROMs, flash memory, volatile or non-volatile memory, or any other suitable digital storage media for storing encoded video data. In a further example, the storage device may correspond to a file server or another intermediate storage device that may store the encoded video generated by source device 12. Destination device 14 may access stored video data from the storage device via streaming or download. The file server may be any type of server capable of storing encoded video data and transmitting that encoded video data to the destination device 14. Example file servers include a web server (e.g., for a website), an FTP server, network attached storage (NAS) devices, or a local disk drive. Destination device 14 may access the encoded video data through any standard data connection, including an Internet connection. This may include a wireless channel (e.g., a Wi-Fi connection), a wired connection (e.g., DSL, cable modem, etc.), or a combination of both that is suitable for accessing encoded video data stored on a file server. The transmission of encoded video data from the storage device may be a streaming transmission, a download transmission, or a combination thereof.

The techniques of this disclosure are not necessarily limited to wireless applications or settings. The techniques may be applied to video coding in support of any of a variety of multimedia applications, such as over-the-air television broadcasts, cable television transmissions, satellite television transmissions, Internet streaming video transmissions, such as dynamic adaptive streaming over HTTP (DASH), digital video that is encoded onto a data storage medium, decoding of digital video stored on a data storage medium, or other applications. In some examples, system 10 may be configured to support one-way or two-way video transmission to support applications such as video streaming, video playback, video broadcasting, and/or video telephony.

In the example of FIG. 1, source device 12 includes video source 18, video encoder 20, and output interface 22. Destination device 14 includes input interface 28, video decoder 30, and display device 31. In accordance with this disclosure, video encoder 20 of source device 12 may be configured to apply the techniques for coding data according to an enhanced CABAC design. In other examples, a source device and a destination device may include other components or arrangements. For example, source device 12 may receive video data from an external video source 18, such as an external camera. Likewise, destination device 14 may interface with an external display device, rather than including an integrated display device.

The illustrated system 10 of FIG. 1 is merely one example. Techniques for coding data according to an enhanced CABAC design may be performed by any digital video encoding and/or decoding device. Although generally the techniques of this disclosure are performed by a video encoding device, the techniques may also be performed by a video encoder/decoder, typically referred to as a "CODEC." Moreover, the techniques of this disclosure may also be performed by a video preprocessor. Source device 12 and destination device 14 are merely examples of such coding devices in which source device 12 generates coded video data for transmission to destination device 14. In some examples, devices 12, 14 may operate in a substantially symmetrical manner such that each of devices 12, 14 include video encoding and decoding components. Hence, system 10 may support one-way or two-way video transmission between video devices 12, 14, e.g., for video streaming, video playback, video broadcasting, or video telephony.

Video source 18 of source device 12 may include a video capture device, such as a video camera, a video archive containing previously captured video, and/or a video feed interface to receive video from a video content provider. As a further alternative, video source 18 may generate computer graphics-based data as the source video, or a combination of live video, archived video, and computer-generated video. In some cases, if video source 18 is a video camera, source device 12 and destination device 14 may form so-called camera phones or video phones. As mentioned above, however, the techniques described in this disclosure may be applicable to video coding in general, and may be applied to wireless and/or wired applications. In each case, the captured, pre-captured, or computer-generated video may be encoded by video encoder 20. The encoded video information may then be output by output interface 22 onto a computer-readable medium 16.

Computer-readable medium 16 may include transient media, such as a wireless broadcast or wired network transmission, or non-transient storage media (that is, non-transitory storage media), such as a hard disk, flash drive, compact disc, digital video disc, Blu-ray disc, or other computer-readable media. In some examples, a network server (not shown) may receive encoded video data from source device 12 and provide the encoded video data to destination device 14, e.g., via network transmission. Similarly, a computing device of a medium production facility, such as a disc stamping facility, may receive encoded video data from source device 12 and produce a disc containing the encoded video data. When processed by a video decoding device, the encoded video data on the disc may cause the video decoding device to decode the video data according to various examples disclosed herein. Therefore, computer-readable medium 16 may be understood to include one or more computer-readable media of various forms, in various examples.

Input interface 28 of destination device 14 receives information from computer-readable medium 16. The information of computer-readable medium 16 may include syntax information defined by video encoder 20, which is also used by video decoder 30, that includes syntax elements that describe characteristics and/or processing of blocks and other coded units, e.g., GOPs. Display device 32 displays the decoded video data to a user, and may comprise any of a variety of display devices such as a cathode ray tube (CRT), a liquid crystal display (LCD), a plasma display, an organic light emitting diode (OLED) display, or another type of display device.

Video encoder 20 and video decoder 30 may operate according to a video coding standard, such as the High Efficiency Video Coding (HEVC) standard, also referred to as ITU-T H.265. Alternatively, video encoder 20 and video decoder 30 may operate according to other proprietary or industry standards, such as the ITU-T H.264 standard, alternatively referred to as MPEG-4, Part 10, Advanced Video Coding (AVC), or extensions of such standards. The techniques of this disclosure, however, are not limited to any particular coding standard. Other examples of video coding standards include MPEG-2 and ITU-T H.263. Although not shown in FIG. 1, in some aspects, video encoder 20 and video decoder 30 may each be integrated with an audio encoder and decoder, and may include appropriate MUX-DEMUX units, or other hardware and software, to handle encoding of both audio and video in a common data stream or separate data streams. If applicable, MUX-DEMUX units may conform to the ITU H.223 multiplexer protocol, or other protocols such as the user datagram protocol (UDP).

Video encoder 20 and video decoder 30 each may be implemented as any of a variety of suitable encoder circuitry, such as one or more microprocessors, digital signal processors (DSPs), application specific integrated circuits (ASICs), field programmable gate arrays (FPGAs), discrete logic, software, hardware, firmware or any combinations thereof. When the techniques are implemented partially in software, a device may store instructions for the software in a suitable, non-transitory computer-readable medium and execute the instructions in hardware using one or more processors to perform the techniques of this disclosure. Each of video encoder 20 and video decoder 30 may be included in one or more encoders or decoders, either of which may be integrated as part of a combined encoder/decoder (CODEC) in a respective device.

In general, according to HEVC, a video frame or picture may be divided into a sequence of treeblocks or largest coding units (LCU) that include both luma and chroma samples. Syntax data within a bitstream may define a size for the LCU, which is a largest coding unit in terms of the number of pixels. A slice includes a number of consecutive treeblocks in coding order. A video frame or picture may be partitioned into one or more slices. Each treeblock may be split into coding units (CUs) according to a quadtree. In general, a quadtree data structure includes one node per CU, with a root node corresponding to the treeblock. If a CU is split into four sub-CUs, the node corresponding to the CU includes four leaf nodes, each of which corresponds to one of the sub-CUs.

Each node of the quadtree data structure may provide syntax data for the corresponding CU. For example, a node in the quadtree may include a split flag, indicating whether the CU corresponding to the node is split into sub-CUs.

Syntax elements for a CU may be defined recursively, and may depend on whether the CU is split into sub-CUs. If a CU is not split further, it is referred as a leaf-CU. In this disclosure, four sub-CUs of a leaf-CU will also be referred to as leaf-CUs even if there is no explicit splitting of the original leaf-CU. For example, if a CU at 16×16 size is not split further, the four 8×8 sub-CUs will also be referred to as leaf-CUs although the 16×16 CU was never split.

A CU has a similar purpose as a macroblock of the H.264 standard, except that a CU does not have a size distinction. For example, a treeblock may be split into four child nodes (also referred to as sub-CUs), and each child node may in turn be a parent node and be split into another four child nodes. A final, unsplit child node, referred to as a leaf node of the quadtree, comprises a coding node, also referred to as a leaf-CU. Syntax data associated with a coded bitstream may define a maximum number of times a treeblock may be split, referred to as a maximum CU depth, and may also define a minimum size of the coding nodes. Accordingly, a bitstream may also define a smallest coding unit (SCU). This disclosure uses the term "block" to refer to any of a CU, prediction unit (PU), or transform unit (TU), in the context of HEVC, or similar data structures in the context of other standards (e.g., macroblocks and sub-blocks thereof in H.264/AVC).

A CU includes a coding node and prediction units (PUs) and transform units (TUs) associated with the coding node. A size of the CU corresponds to a size of the coding node and is generally square in shape. The size of the CU may range from 8×8 pixels up to the size of the treeblock with a maximum size, e.g., 64×64 pixels or greater. Each CU may contain one or more PUs and one or more TUs. Syntax data associated with a CU may describe, for example, partitioning of the CU into one or more PUs. Partitioning modes may differ between whether the CU is skip or direct mode encoded, intra-prediction mode encoded, or inter-prediction mode encoded. PUs may be partitioned to be non-square in shape. Syntax data associated with a CU may also describe, for example, partitioning of the CU into one or more TUs according to a quadtree. A TU can be square or non-square (e.g., rectangular) in shape.

The HEVC standard allows for transformations according to TUs, which may be different for different CUs. The TUs are typically sized based on the size of PUs within a given CU defined for a partitioned LCU, although this may not always be the case. The TUs are typically the same size or smaller than the PUs. In some examples, residual samples corresponding to a CU may be subdivided into smaller units using a quadtree structure known as "residual quad tree" (RQT). The leaf nodes of the RQT may be referred to as transform units (TUs). Pixel difference values associated with the TUs may be transformed to produce transform coefficients, which may be quantized.

A leaf-CU may include one or more prediction units (PUs). In general, a PU represents a spatial area corresponding to all or a portion of the corresponding CU, and may include data for retrieving and/or generating a reference sample for the PU. Moreover, a PU includes data related to prediction. For example, when the PU is intra-mode encoded, data for the PU may be included in a residual quadtree (RQT), which may include data describing an intra-prediction mode for a TU corresponding to the PU. The RQT may also be referred to as a transform tree. In some examples, the intra-prediction mode may be signaled in the leaf-CU syntax, instead of the RQT. As another example, when the PU is inter-mode encoded, the PU may include data defining motion information, such as one or more motion vectors, for the PU. The data defining the motion vector for a PU may describe, for example, a horizontal component of the motion vector, a vertical component of the motion vector, a resolution for the motion vector (e.g., one-quarter pixel precision or one-eighth pixel precision), a reference picture to which the motion vector points, and/or a reference picture list (e.g., List 0, List 1, or List C) for the motion vector.

A leaf-CU having one or more PUs may also include one or more transform units (TUs). The transform units may be specified using an RQT (also referred to as a TU quadtree structure), as discussed above. For example, a split flag may indicate whether a leaf-CU is split into four transform units. Then, each transform unit may be split further into further sub-TUs. When a TU is not split further, it may be referred to as a leaf-TU. Generally, for intra coding, all the leaf-TUs belonging to a leaf-CU share the same intra prediction mode. That is, the same intra-prediction mode is generally applied to calculate predicted values for all TUs of a leaf-CU. For intra coding, a video encoder may calculate a residual value for each leaf-TU using the intra prediction mode, as a difference between the portion of the CU corresponding to the TU and the original block. A TU is not necessarily limited to the size of a PU. Thus, TUs may be larger or smaller than a PU. For intra coding, a PU may be collocated with a corresponding leaf-TU for the same CU. In some examples, the maximum size of a leaf-TU may correspond to the size of the corresponding leaf-CU.

Moreover, TUs of leaf-CUs may also be associated with respective quadtree data structures, referred to as residual quadtrees (RQTs). That is, a leaf-CU may include a quadtree indicating how the leaf-CU is partitioned into TUs. The root node of a TU quadtree generally corresponds to a leaf-CU, while the root node of a CU quadtree generally corresponds to a treeblock (or LCU). TUs of the RQT that are not split are referred to as leaf-TUs. In general, this disclosure uses the terms CU and TU to refer to leaf-CU and leaf-TU, respectively, unless noted otherwise.

A video sequence typically includes a series of video frames or pictures. A group of pictures (GOP) generally comprises a series of one or more of the video pictures. A GOP may include syntax data in a header of the GOP, a header of one or more of the pictures, or elsewhere, that describes a number of pictures included in the GOP. Each slice of a picture may include slice syntax data that describes an encoding mode for the respective slice. Video encoder 20 typically operates on video blocks within individual video slices in order to encode the video data. A video block may correspond to a coding node within a CU. The video blocks may have fixed or varying sizes, and may differ in size according to a specified coding standard.

As an example, prediction may be performed for PUs of various sizes. Assuming that the size of a particular CU is 2N×2N, intra-prediction may be performed on PU sizes of 2N×2N or N×N, and inter-prediction may be performed on symmetric PU sizes of 2N×2N, 2N×N, N×2N, or N×N. Asymmetric partitioning for inter-prediction may also be performed for PU sizes of 2N×nU, 2N×nD, nL×2N, and nR×2N. In asymmetric partitioning, one direction of a CU is not partitioned, while the other direction is partitioned into 25% and 75%. The portion of the CU corresponding to the 25% partition is indicated by an "n" followed by an indication of "Up", "Down," "Left," or "Right." Thus, for example, "2N×nU" refers to a 2N×2N CU that is partitioned horizontally with a 2N×0.5N PU on top and a 2N×1.5N PU on bottom.

In this disclosure, "N×N" and "N by N" may be used interchangeably to refer to the pixel dimensions of a video block in terms of vertical and horizontal dimensions, e.g., 16×16 pixels or 16 by 16 pixels. In general, a 16×16 block will have 16 pixels in a vertical direction (y=16) and 16 pixels in a horizontal direction (x=16). Likewise, an N×N block generally has N pixels in a vertical direction and N pixels in a horizontal direction, where N represents a non-negative integer value. The pixels in a block may be arranged in rows and columns. Moreover, blocks need not necessarily have the same number of pixels in the horizontal direction as in the vertical direction. For example, blocks may comprise N×M pixels, where M is not necessarily equal to N.

Following intra-predictive or inter-predictive coding using the PUs of a CU, video encoder 20 may calculate residual data for the TUs of the CU. The PUs may comprise syntax data describing a method or mode of generating predictive pixel data in the spatial domain (also referred to as the pixel domain) and the TUs may comprise coefficients in the transform domain following application of a transform, e.g., a discrete cosine transform (DCT), an integer transform, a wavelet transform, or a conceptually similar transform to residual video data. The residual data may correspond to pixel differences between pixels of the unencoded picture and prediction values corresponding to the PUs. Video encoder 20 may form the TUs to include quantized transform coefficients representative of the residual data for the CU. That is, video encoder 20 may calculate the residual data (in the form of a residual block), transform the residual block to produce a block of transform coefficients, and then quantize the transform coefficients to form quantized transform coefficients. Video encoder 20 may form a TU including the quantized transform coefficients, as well as other syntax information (e.g., splitting information for the TU).

As noted above, following any transforms to produce transform coefficients, video encoder 20 may perform quantization of the transform coefficients. Quantization generally refers to a process in which transform coefficients are quantized to possibly reduce the amount of data used to represent the coefficients, providing further compression. The quantization process may reduce the bit depth associated with some or all of the coefficients. For example, an n-bit value may be rounded down to an m-bit value during quantization, where n is greater than m.

Following quantization, the video encoder may scan the transform coefficients, producing a one-dimensional vector from the two-dimensional matrix including the quantized transform coefficients. The scan may be designed to place higher energy (and therefore lower frequency) coefficients at the front of the array and to place lower energy (and therefore higher frequency) coefficients at the back of the array. In some examples, video encoder 20 may utilize a predefined scan order to scan the quantized transform coefficients to produce a serialized vector that can be entropy encoded. In other examples, video encoder 20 may perform an adaptive scan. After scanning the quantized transform coefficients to form a one-dimensional vector, video encoder 20 may entropy encode the one-dimensional vector, e.g., according to the context-adaptive binary arithmetic coding (CABAC) design described in this disclosure. Video encoder 20 may also entropy encode syntax elements associated with the encoded video data for use by video decoder 30 in decoding the video data.

In general, video decoder 30 performs a substantially similar, albeit reciprocal, process to that performed by video encoder 20 to decode encoded data. For example, video decoder 30 inverse quantizes and inverse transforms coefficients of a received TU to reproduce a residual block. Video decoder 30 uses a signaled prediction mode (intra- or inter-prediction) to form a predicted block. Then video decoder 30 combines the predicted block and the residual block (on a pixel-by-pixel basis) to reproduce the original block. Additional processing may be performed, such as performing a deblocking process to reduce visual artifacts along block boundaries. Furthermore, video decoder 30 may decode syntax elements using CABAC in a manner substantially similar to, albeit reciprocal to, the CABAC encoding process of video encoder 20.

This disclosure may generally refer to video encoder 20 "signaling" certain information to another device, such as video decoder 30. It should be understood, however, that video encoder 20 may signal information by associating certain syntax elements with various encoded portions of video data. That is, video encoder 20 may "signal" data by storing certain syntax elements to headers of various encoded portions of video data. In some cases, such syntax elements may be encoded and stored (e.g., stored to storage device 32) prior to being received and decoded by video decoder 30. Thus, the term "signaling" may generally refer to the communication of syntax or other data for decoding compressed video data, whether such communication occurs in real- or near-real-time or over a span of time, such as might occur when storing syntax elements to a medium at the time of encoding, which then may be retrieved by a decoding device at any time after being stored to this medium.

The following section will describe BAC and CABAC techniques in more detail. BAC, in general, is a recursive interval-subdividing procedure. BAC is used to encode bins in the CABAC process in the H.264/AVC and H.265/HEVC video coding standards. The output of the BAC coder is a binary stream that represents a value or pointer to a probability within a final coded probability interval. The probability interval is specified by a range and a lower end value. Range is the extension of the probability interval. Low is the lower bound of the coding interval.

Application of arithmetic coding to video coding is described in D. Marpe, H. Schwarz, and T. Wiegand "Context-Based Adaptive Binary Arithmetic Coding in the H.264/AVC Video Compression Standard," IEEE Trans. Circuits and Systems for Video Technology, vol. 13, no. 7, July 2003. CABAC involves three main functions, namely, binarization, context modeling, and arithmetic coding. Binarization refers to the function of mapping syntax elements to binary symbols (or "bins"). Binary symbols may also be referred to as "bin strings." Context modeling refers to the function of estimating the probability of the various bins. Arithmetic coding refers to the subsequent function of compressing the bins to bits, based on the estimated probability. Various devices and/or modules thereof, such as a binary arithmetic coder, may perform the function of arithmetic coding.

Several different binarization processes are used in HEVC, including unary (U), truncated unary (TU), kth-order Exp-Golomb (EGk), and fixed length (FL). Details of various binarization processes are described in V. Sze and M. Budagavi, "High throughput CABAC entropy coding in HEVC," IEEE Transactions on Circuits and Systems for Video Technology (TCSVT), vol. 22, no. 12, pp. 1778-1791, December 2012.

Each context (i.e., probability model) in CABAC is represented by a state. Each state ($\sigma$) implicitly represents a probability ($p_\sigma$) of a particular symbol (e.g., a bin) being the Least Probable Symbol (LPS). A symbol can be an LPS or a Most Probable Symbol (MPS). Symbols are binary, and as such, the MPS and the LPS can be 0 or 1. The probability is estimated for the corresponding context and used (implicitly) to entropy code the symbol using the arithmetic coder.

The process of BAC is handled by a state machine that changes its internal values 'range' and 'low' depending on the context to code and the value of the bin being coded. Depending on the state of a context (that is, its probability), the range is divided into rangeMPS$_\sigma$ (range of the most probable symbol in state$_\sigma$) and rangeLPS$_\sigma$ (range of the least probable symbol in state$_\sigma$). In theory, the rangeLPS$_\sigma$ value of a probability state$_\sigma$ is derived by a multiplication:

$$rangeLPS_\sigma = range \times p_\sigma,$$

where $p_\sigma$ is the probability to select the LPS. Of course, the probability of MPS is $1-p_\sigma$. Equivalently, the rangeMPS$_\sigma$ is equal to range minus rangeLPS$_\sigma$. BAC iteratively updates the range depending on the state of the context bin to code, the current range, and the value of the bin being coded (i.e., is the bin equal to the LPS or the MPS).

Figure 2A:
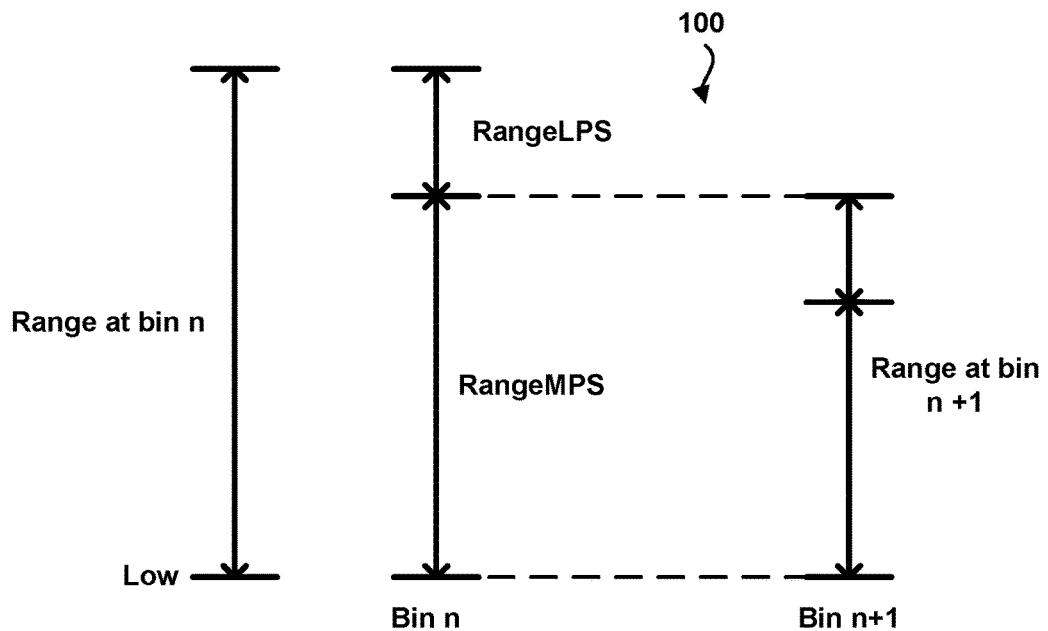
FIGS. 2A and 2B are conceptual diagrams illustrating a range update process in binary arithmetic coding.
Figure 2B:
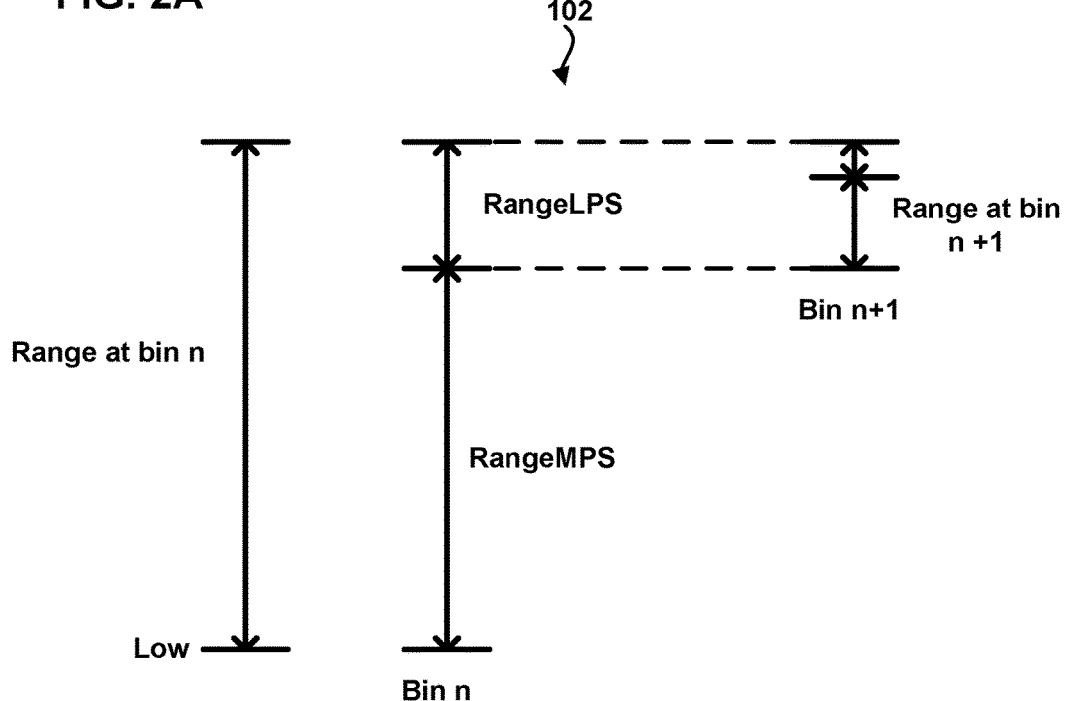

FIGS. 2A and 2B show examples of this process at bin n. In example 100 of FIG. 2A, at bin n the range at bin 2 includes the RangeMPS and RangeLPS given by the probability of the LPS ($p_\sigma$) given a certain context state ($\sigma$). Example 100 shows the update of the range at bin n+1 when the value of bin n is equal to the MPS. In this example, the low stays the same, but the value of the range at bin n+1 is reduced to the value of RangeMPS at bin n. Example 102 of FIG. 2B shows the update of the range at bin n+1 when the value of bin n is not equal to the MPS (i.e., equal to the LPS). In this example, the low is moved to the lower range value of RangeLPS at bin n. In addition, the value of the range at bin n+1 is reduced to the value of RangeLPS at bin n.

Figure 3:
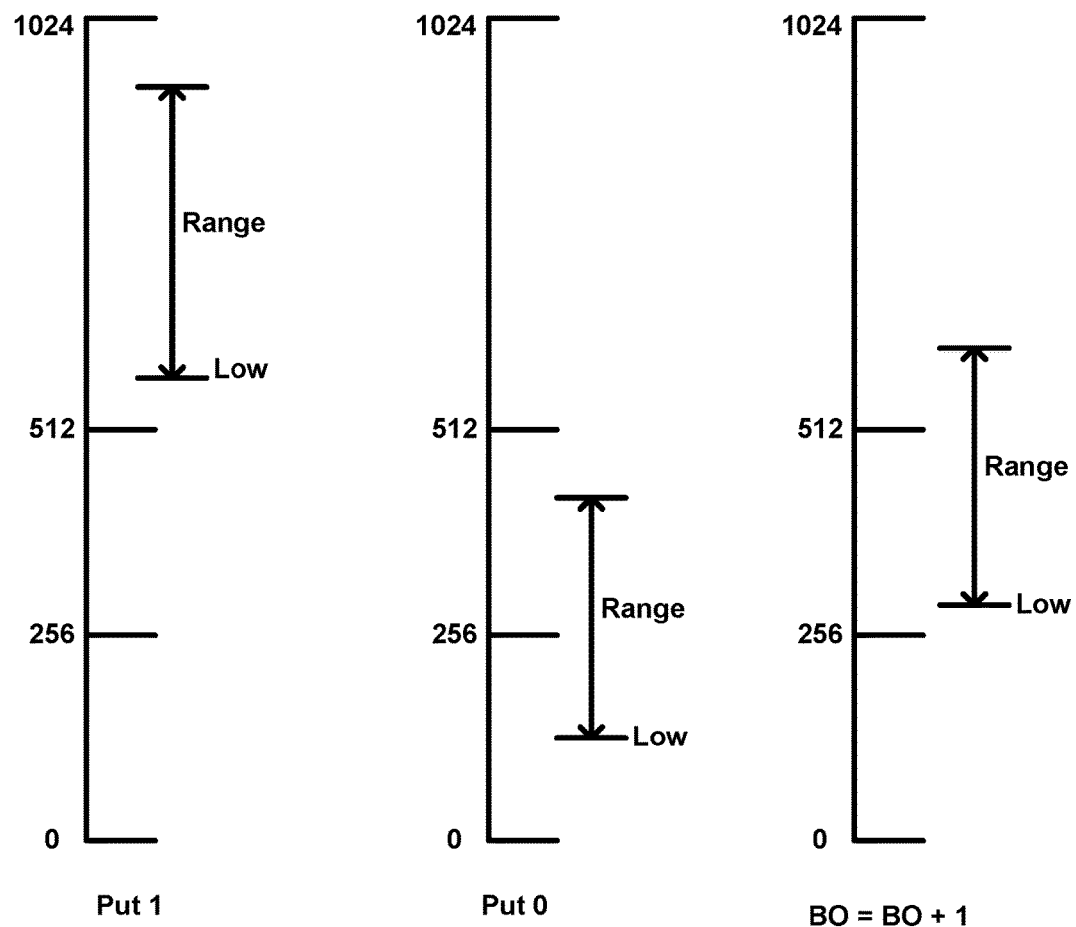
FIG. 3 is a conceptual diagram illustrating an output process in binary arithmetic coding.

In HEVC, the range is expressed with 9 bits and the low with 10 bits. There is a renormalization process to maintain the range and low values at sufficient precision. The renormalization occurs whenever the range is less than 256. Therefore, the range is always equal or larger than 256 after renormalization. Depending on the values of range and low, the BAC outputs to the bitstream, a '0,' or a '1,' or updates an internal variable (called BO: bits-outstanding) to keep for future outputs. FIG. 3 shows examples of BAC output depending on the range. For example, a '1' is output to the bitstream when the range and low are above a certain threshold (e.g., 512). A '0' is output to the bitstream when the range and low are below a certain threshold (e.g., 512). Nothing is output to the bitstream when the range and lower are between certain thresholds. Instead, the BO value is incremented and the next bin is encoded.

In the CABAC context model of HEVC, there are 128 states. There are 64 possible LPS probabilities (denoted by state a) that can be from 0 to 63. Each MPS can be zero or one. As such, the 128 states are 64 state probabilities times the 2 possible values for MPS (0 or 1). Therefore, the probability models may be stored as 7-bit entries. In each 7-bit entry, 6 bits may be allocated for representing the probability state, and 1 bit may be allocated for the most probable symbol (MPS) in the applicable context memory.

To reduce the computation of deriving LPS ranges (rangeLPS$_\sigma$), results for all cases are pre-calculated and stored as approximations in a look-up table in HEVC. Therefore, the LPS range can be obtained without any multiplication by using a simple table lookup. Avoiding multiplication can be important for some devices or applications, since this operation may cause significant latency in many hardware architectures.

A 4-column pre-calculated LPS range table may be used instead of the multiplication. The range is divided into four segments. The segment index can be derived by the question (range>>6)&3. In effect, the segment index is derived by shifting and dropping bits from the actual range. The following Table 1 shows the possible ranges and their corresponding indexes.

TABLE 1

| | Range Index | | | |
|---|---|---|---|---|
| Range | 256-319 | 320-383 | 384-447 | 448-511 |
| (range >> 6) & 3 | 0 | 1 | 2 | 3 |

The LPS range table has then 64 entries (one for each probability state) times 4 (one for each range index). Each entry is the Range LPS, that is, the value of multiplying the range times the LPS probability. An example of part of this table is shown in the following Table 2. Table 2 depicts probability states 9-12. In one proposal for HEVC, the probability states may range from 0-63

TABLE 2

| | RangeLPS | | | |
|---|---|---|---|---|
| Prob State ($\sigma$) | Index 0 | Index 1 | Index 2 | Index 3 |
| ... | ... | ... | ... | ... |
| 9 | 90 | 110 | 130 | 150 |
| 10 | 85 | 104 | 123 | 142 |
| 11 | 81 | 99 | 117 | 135 |
| 12 | 77 | 94 | 111 | 128 |
| ... | ... | ... | ... | ... |

In each segment (i.e., range value), the LPS range of each probability state a is pre-defined. In other words, the LPS range of a probability state$_\sigma$ is quantized into four values (i.e., one value for each range index). The specific LPS range used at a given point depends on which segment the range belongs to. The number of possible LPS ranges used in the table is a trade-off between the number of table columns (i.e., the number of possible LPS range values) and the LPS range precision. Generally speaking, more columns results in smaller quantization errors of LPS range values, but also increases the need for more memory to store the table. Fewer columns increases quantization errors, but also reduces the memory needed to store the table.

As described above, each LPS probability state has a corresponding probability. In HEVC, 64 representative probability values $p_\sigma \in [0.01875, 0.5]$ are derived for the LPS (least probable symbol) in accordance with Equation (1), below, which is a recursive equation.

$$p_\sigma = \alpha * p_{\sigma-1} \text{ for all } \sigma = 1, \ldots, 63 \quad (1)$$

$$\text{with } \alpha = \left(\frac{0.01875}{0.5}\right)^{1/63}$$

In the example above, both the chosen scaling factor $\alpha \approx 0.9492$ and the cardinality N=64 of the set of probabilities represent a good compromise between the accuracy of probability representation and the desire for fast adaptation. In some examples, a value of $\alpha$ closer to 1 may result in slow adaptation with higher accuracy ("steady-state behavior"), while faster adaptation can be achieved for the non-stationary case with decreasing values of α at the cost of reduced accuracy. The scaling factor α may correspond to a window size that indicates a number of previously encoded bins which have significant influence to the current up-date. The probability of the MPS (most probable symbol) is equal to 1 minus the probability of the LPS (least probable symbol). In other words, the probability of the MPS can be represented by the formula (1−LPS), where 'LPS' represents the probability of the LPS. Therefore, the probability range that can be represented by CABAC in HEVC is [0.01875, 0.98125 (=1−0.01875)].

CABAC is adaptive because the probability states of a context used to code bits (or "bins") of a value for a syntax element are updated in order to follow the signal statistics (i.e., the values of previously coded bins, e.g., for the syntax element). The update process is as follows. For a given probability state, the update depends on the state index and the value of the encoded symbol identified either as an LPS or an MPS. As a result of the updating process, a new probability state is derived, which includes a potentially modified LPS probability estimate and, if necessary, a modified MPS value.

Context switching may occur after the coding of each bin. In the event of a bin value equaling the MPS, a given state index is simply incremented by 1. This for all states except when an MPS occurs at state index 62, where the LPS probability is already at its minimum (or equivalently, the maximum MPS probability is reached). In this case, the state index remains fixed until an LPS is seen, or the last bin value is encoded (a special end state is used for the special case of the last bin value). When an LPS occurs, the state index is changed by decrementing the state index by a certain amount, as shown in the equation below. This rule applies in general to each occurrence of a LPS with the following exception. Assuming a LPS has been encoded at the state with index σ=0, which corresponds to the equi-probable case, the state index remains fixed, but the MPS value will be toggled such that the value of the LPS and MPS will be interchanged. In all other cases, no matter which symbol has been encoded, the MPS value will not be altered. In general, a video coder may derive the new probability state in accordance with Equation (2), below, which shows a relation between a given LPS probability $p_{old}$ and its updated counterpart $p_{new}$.

$$p_{new} = \begin{cases} \max(\alpha * p_{old}, p_{62}), & \text{if a } MPS \text{ occurs} \\ \alpha * p_{old} + (1-\alpha), & \text{if a } LPS \text{ occurs} \end{cases} \quad (2)$$

To reduce the complexity, a video coder may implement CABAC such that all transition rules can be realized by at most two tables each having a number of entries. As one example, all transition rules may be realized by at most two tables that each have 128 entries of 7-bit unsigned integer values (e.g., Tables 3 and 4, below). As another example, all transition rules may be realized by at most two tables that each have 63 entries of 6-bit unsigned integer values (e.g., Table 9-41 of HEVC). Given a state index i, after updating, a video coder may define as the new state index TransIdxMPS[i] when a MPS values is coded, or TransIdxLPS[i] when a LPS values is coded.

TABLE 3

TransIdxMPS[ 128 ] =
{
    2, 3, 4, 5, 6, 7, 8, 9, 10, 11, 12, 13, 14, 15, 16, 17,
    18, 19, 20, 21, 22, 23, 24, 25, 26, 27, 28, 29, 30, 31, 32, 33,
    34, 35, 36, 37, 38, 39, 40, 41, 42, 43, 44, 45, 46, 47, 48, 49,
    50, 51, 52, 53, 54, 55, 56, 57, 58, 59, 60, 61, 62, 63, 64, 65,
    66, 67, 68, 69, 70, 71, 72, 73, 74, 75, 76, 77, 78, 79, 80, 81,
    82, 83, 84, 85, 86, 87, 88, 89, 90, 91, 92, 93, 94, 95, 96, 97,
    98, 99, 100, 101, 102, 103, 104, 105, 106, 107, 108, 109, 110, 111,
    112, 113, 114, 115, 116, 117, 118, 119, 120, 121, 122, 123, 124,
    125, 124, 125, 126, 127
};

TABLE 4

TransIdxLPS[ 128 ] =
{
    1, 0, 0, 1, 2, 3, 4, 5, 4, 5, 8, 9, 8, 9, 10, 11,
    12, 13, 14, 15, 16, 17, 18, 19, 18, 19, 22, 23, 22, 23, 24, 25,
    26, 27, 26, 27, 30, 31, 30, 31, 32, 33, 32, 33, 36, 37, 36, 37,
    38, 39, 38, 39, 42, 43, 42, 43, 44, 45, 44, 45, 46, 47, 48, 49,
    48, 49, 50, 51, 52, 53, 52, 53, 54, 55, 54, 55, 56, 57, 58, 59,
    58, 59, 60, 61, 60, 61, 60, 61, 62, 63, 64, 65, 64, 65, 66, 67,
    66, 67, 66, 67, 68, 69, 68, 69, 70, 71, 70, 71, 70, 71, 72, 73,
    72, 73, 72, 73, 74, 75, 74, 75, 74, 75, 76, 77, 76, 77, 126, 127
};

In some examples, a video coder may determine state transitions with a single table TransIdxLPS, which determines, for a given state index σ, the new updated state index TransIdxLPS[σ] in case an LPS has been observed. The MPS-driven transitions can be obtained by a simple (saturated) increment of the state index by the fixed value of 1, resulting in an updated state index min(σ+1, 62).

As discussed above, context modeling provides accurate probability estimation, which is a contributing factor for achieving higher coding efficiency. Accordingly, context modeling is an adaptive process. Different contexts can be used for different bins, and the probability of the contexts may be updated based on the values of previously-coded bins. Bins with similar distributions often share the same context. The context for each bin can be selected based on the type of syntax element, bin position in syntax element (binIdx), luma/chroma information, neighboring information, etc.

Before coding a given slice, the probability models are initialized based on one or more pre-defined values. For example, given an input quantization parameter denoted by qp and the pre-defined value denoted by initVal, the 7-bit entry of the probability model (denoted by state and MPS) could be derived in accordance with Equations (3), below.

$qp$=Clip3(0, 51, $qp$);

slope=(initVal>>4)*5−45;

offset=((initVal&15)<<3)−16;

initState=min(max(1, (((slope*$qp$)>>4)+offset)), 126);

MPS=(initState>=64);

state index=((mpState?(initState−64):(63−initState))<<1)+MPS;    (3)

The derived state index implicitly includes the MPS information. More specifically, when the state index is an even value, the MPS value is equal to 0. Conversely, when the state index is an odd value, the MPS value is equal to 1.

The value of "initVal" is in a range of [0, 255] with 8-bit precision. The pre-defined value "initVal" is slice-dependent. In other words, three sets of context initialization parameters for the probability models are used, one each in I, P, and B slices, respectively. In this way, a video encoding device configured to perform CABAC is enabled to choose for these slice types between three initialization tables such that a better fit to different coding scenarios and/or different types of video content can be achieved.

According to HEVC, another tool could be applied to allow one P (or B) slice to be initialized with B (or P) slices. Conversely, the tool could be applied to allow one B slice to be initialized with P slices. The related syntax elements are described in Table 5 below (which corresponds to Section 7.3.6.1 of HEVC), and the related semantics and decoding process are described below, after Table 5.

TABLE 5

|  | Descriptor |
|---|---|
| slice_segment_header( ) { | |
|   first_slice_segment_in_pic_flag | u(1) |
|   if( nal_unit_type >= BLA_W_LP && nal_unit_type <= RSV_IRAP_VCL23 ) | |
|     no_output_of_prior_pics_flag | u(1) |
|   slice_pic_parameter_set_id | ue(v) |
|   if( !first_slice_segment_in_pic_flag ) { | |
|     if( dependent_slice_segments_enabled_flag ) | |
|       dependent_slice_segment_flag | u(1) |
|     slice_segment_address | u(v) |
|   } | |
|   if( !dependent_slice_segment_flag) { | |
|     for( i = 0; i < num_extra_slice_header_bits; i++ ) | |
|       slice_reserved_flag[ i ] | u(1) |
|     slice_type | ue(v) |
|     if( output_flag_present_flag ) | |
|       pic_output_flag | u(1) |
|     if( separate_colour_plane_flag = = 1 ) | |
|       colour_plane_id | u(2) |
|     if( nal_unit_type != IDR_W_RADL && nal_unit_type != IDR_N_LP ) { | |
|       slice_pic_order_cnt_lsb | u(v) |
|       short_term_ref_pic_set_sps_flag | u(1) |
|       if( !short_term_ref_pic_set_sps_flag ) | |
|         short_term_ref_pic_set( num_short_term_ref_pic_sets ) | |
|       else if( num_short_term_ref_pic_sets > 1 ) | |
|         short_term_ref_pic_set_idx | u(v) |
|       if( long_term_ref_pics_present_flag ) { | |
|     ... | |
|       } | |
|     } | |
|     if( sps_temporal_mvp_enabled_flag ) | |
|       slice_temporal_mvp_enabled_flag | u(1) |
|   } | |
|   if( sample_adaptive_offset_enabled_flag ) { | |
|     slice_sao_luma_flag | u(1) |
|     slice_sao_chroma_flag | u(1) |
|   } | |
|   if( slice_type = = P | | slice_type = = B ) { | |
|     num_ref_idx_active_override_flag | u(1) |
|     if( num_ref_idx_active_override_flag ) { | |
|       num_ref_idx_l0_active_minus1 | ue(v) |
|       if( slice_type = = B ) | |
|         num_ref_idx_l1_active_minus1 | ue(v) |
|     } | |
|     if( lists_modification_present_flag && NumPocTotalCurr > 1 ) | |
|       ref_pic_lists_modification( ) | |
|     if( slice_type = = B ) | |
|       mvd_l1_zero_flag | u(1) |
|     if( cabac_init_present_flag ) | |
|       cabac_init_flag | u(1) |
|     if( slice_temporal_mvp_enabled_flag ) { | |
|       if( slice_type = = B ) | |
|         collocated_from_l0_flag | u(1) |
|       if( ( collocated_from_l0_flag && num_ref_idx_l0_active_minus1 > 0 ) | | | |
|         ( !collocated_from_l0_flag && num_ref_idx_l1_active_minus1 > 0 )) | |
|         collocated_ref_idx | ue(v) |
|     } | |
|     if( ( weighted_pred_flag && slice_type = = P ) | | | |
|       ( weighted_bipred_flag && slice_type = = B ) ) | |
|       pred_weight_table( ) | |
|     five_minus_max_num_merge_cand | ue(v) |

TABLE 5-continued

| | Descriptor |
|---|---|
|     } <br>     ... <br>     byte_alignment( ) <br> } | |

Semantics for the syntax elements of Table 5 may be defined as follows:

cabac_init_present_flag equal to 1 specifies that cabac_init_flag is present in slice headers referring to the PPS. cabac_init_present_flag equal to 0 specifies that cabac_init_flag is not present in slice headers referring to the PPS.

cabac_init_flag specifies the method for determining the initialization table used in the initialization process for context variables, as defined in the decoding process described below. When cabac_init_flag is not present, it is inferred to be equal to 0.

Descriptors:

ae(v): context-adaptive arithmetic entropy-coded syntax element.

b(8): byte having any pattern of bit string (8 bits).

f(n): fixed-pattern bit string using n bits written (from left to right) with the left bit first.

se(v): signed integer 0-th order Exp-Golomb-coded syntax element with the left bit first.

u(n): unsigned integer using n bits. When n is "v" in the syntax table, the number of bits varies in a manner dependent on the value of other syntax elements.

ue(v): unsigned integer 0-th order Exp-Golomb-coded syntax element with the left bit first.

Table 9-4 of HEVC provides the context index (ctxIdx) for which initialization is needed for each of the three initialization types. Table 9-4 further includes the table number (ctxTable) that includes the values of initValue needed for the initialization. For P and B slice types, the derivation of initType depends on the value of the cabac_init_flag syntax element. A video coder may derive the variable initType is derived as using operations described by the follows following pseudocode:

```
if( slice_type = = I )
    initType = 0
else if( slice_type = = P )
    initType = cabac_init_flag ? 2 : 1
else
    initType = cabac_init_flag ? 1 : 2
```

A new arithmetic coder is described in Alshin et al., "Multi-parameter probability up-date for CABAC," Document: JCTVC-F254, JCT-VC of ITU-T SG 16 WP 3 and ISO/IEC JTC 1/SC 29/WG 11, 6$^{th}$ Meeting: Torino, IT, 14-22 Jul. 2011 (hereinafter "JCTVC-F254") and Alshin et al., "CE1 (subset B): Multi-parameter probability up-date for CABAC," Document: JCTVC-G764, JCT-VC of ITU-T SG 16 WP 3 and ISO/IEC JTC 1/SC 29/WG 11, 7$^{th}$ Meeting: Geneva, CH, 21-30 Nov. 2011 (hereinafter "JCTVC-G764"). In JCTVC-F254 and JCTV-G764, every probability represented as integer number from 1 to 32767. So all calculations are carried out with 16 bits precision. Instead of look-up tables (e.g., TransIdxMPS and TransIdxLPS as discussed above) and exponential mesh for probability which are utilized in AVC CABAC, the coder proposed in JCTVC-F254 and JCTV-G764 utilizes uniform mesh and explicit calculation with a multiplication free formula for probability update.

Suppose that probability $p_i$ is represented by the probability index, which is an integer number $P_i$ from 0 to $2^k$ (with k equal to 15 for example) (e.g., as shown by Equation (4), below).

$$p_i = P_i/2^k \qquad (4)$$

Following the most frequently used following formula for the probability update in modern arithmetic codecs (e.g., as shown by Equation (5), below).

$$p_{new} = \alpha y + (1-\alpha)p_{old} \qquad (5)$$

In Equation (5), y is equal to "zero" if current symbol matches with most probable symbol (MPS) otherwise y is equal to "one". This formula (i.e., Equation (5)) provides estimating value for probability of least probable symbol (LPS). Similar to the above discussion, the parameter $\alpha$ may correspond to a window size that indicates a number of previously encoded bins which have significant influence to the current up-date.

If we assume that the window size (W) is power of two ($W=\frac{1}{2}^M$, M is a positive integer), and given the Pi in equation (4) as the input $p_{old}$, the updated probability index could be rewritten in shown below in Equation (6).

$$P_i = ((2^k) >> M) + P_i - (P_i >> M) \qquad (6)$$

In the one-probability update model proposed by JCTVC-F254 and JCTV-G764, M is fixed for all the contexts and only one register is used to record the updated probabilities. In one example, M is set equal to 6. That is, the window size is equal to 64. The probability update process could be represented by Equation (7), below.

$$P_{new} = ((2^k) >> 6) + P_i - (P_i >> 6) \qquad (7)$$

The main idea of technique proposed by JCTVC-F254 and JCTV-G764 is to use several probability estimations (instead of only one) with different window sizes and combine them as weighted average for next bin probability prediction. Equations (8) and (9), below, illustrate an example of the technique proposed by JCTVC-F254 and JCTV-G764. The calculations in Equation (8) for each probabilities $p_i$ are independent.

$$p_{i\ new} = W_i y + (1-W_i) p_{i\ old} \qquad (8)$$

$$p_{new} = \Sigma \beta_i p_{i\ new} \qquad (9)$$

The calculations in Equation (8) for each probabilities $p_i$ are independent.

In the method proposed by JCTVC-F254 and JCTV-G764, the linear combination for probability estimation consists of two summands corresponding $W_0=16$ and $W_1=256$ ($W_i=1/\alpha_i$) as shown in Equations (10) and (11). In Equations (10) and (11), $Y=2^{15}$ if last coding bin is "1" and Y=0 if last coding bin is "0", ">>M" is right arithmetic shift for M bits.

$$P_0=(Y>>4)+P_0-(P_0>>4) \quad (10)$$

$$P_1=(Y>>8)+P_1-(P_0>>8) \quad (11)$$

$$P=(P_0+P_1+1)>>1 \quad (12)$$

For short transition period, only short distance prediction (i.e., smaller window size) with fast updating speed is preferable. But after stabilization near optimal value two-probability update model is more accurate for majority of contexts. JCTVC-F254 and JCTV-G764 propose to introduce a counter of updates since last initialization. After every up-date the counter increases by one. Until the counter exceeds some threshold only short "window size" model as defined by Equation (10) will be used. When the counter reaches threshold we should switch to more accurate two-probability update model as defined by Equation (12), above. The range calculation process proposed by JCTVC-F254 and JCTV-G764 is performed with a 512×64 lookup table.

According to the method proposed by JCTVC-F254 and JCTV-G764, a different context initialization method is applied. Specifically, two-parameters (denoted by asCtxInit[0] and asCtxInit[1], respectively) are pre-defined for each context as shown in Equations (13).

Int iQPreper=I slice?37:40;

Int c=asCtxInit[0]+asCtxInit[1]*(iQp−iQPreper);

$$iP0=\min(\max(1, c), 32767); \quad (13)$$

For one-probability update model, the context is represented by iP0 with 15-bit precision. For two-probabilities update model, another variable iP1 is firstly set equal to iP0 and the counter of how many bins have been coded are further required. In the method proposed by JCTVC-F254 and JCTV-G764, both asCtxInit[0] and asCtxInit[1] are stored in 16-bit.

However, in some examples, the above-described techniques (i.e., the CABAC techniques of HEVC and the modification proposed by JCTVC-F254 and JCTV-G764) may have one or more problems which may reduce coding efficiency and/or sub-optimally utilize coder system resources.

As one example, in the above-described look-up table based arithmetic coder technique (e.g., as used in HEVC or H.264/AVC) the probability update is based on fixed tables (i.e., TransIdxLPS and TransIdxMPS) with a fixed window size. This use of fixed window size results in the updating speed being fixed. However, the frequencies that syntax elements occur and are needed to be coded may be quite different for a given CTU or slice. The limitation of a fixed updating speed combined with syntax elements occurring at different frequencies for a given CTU or slice may result in the estimated probabilities of less frequently occurring syntax elements being suboptimal. For example, for one CU, up to 2 values of inter_pred_idc may be signalled, while the transform coefficients within one CU may be coded several times. In this case, when using the same updating speed for these syntax elements, the estimated probability of inter_pred_idc equal to 1 may be still suboptimal after coding one whole slice even though the probability of transform coefficients may have become relatively optimal.

As another example, in the above-described arithmetic coder based on counter technique (e.g., as proposed by JCTVC-F254 and JCTV-G764), the probability updating speed is fixed while the high precision (e.g., possible probability index could be $[1, 2^{15}-1]$) results in low efficiency for syntax elements which are less frequently selected, which may not be desirable.

As another example, in the two-probabilities update model component of the arithmetic coder based on counter technique, two status parameters (probability indices) have to be stored and updated, which may undesirably restrict the throughput of the CABAC process.

As yet another example, in image/video coding systems, hundreds of contexts may be used. In the technique proposed by JCTVC-F254 and JCTV-G764, 32 bits are required per context while only 8 bits are enough for the arithmetic coder in HEVC. Therefore, the storage of pre-defined values for context initialization in the technique proposed by JCTVC-F254 and JCTV-G764 is increased by 300%, which may be undesirable for hardware implementation in terms of storage.

In accordance with one or more techniques of this disclosure, a video coder (e.g., video encoder 20 and/or video decoder 30) may use different window sizes for different contexts. For instance, as opposed to HEVC which uses a fixed window size for all contexts, a video coder may use a first window size when updating a first context and use a second, different, window size when updating a second context. In some examples, a video coder may use relatively smaller window sizes for contexts that are infrequently used and may use relatively larger window sizes for contexts that are frequently used. By using window sizes that are more closely tailored to the frequencies at which the contexts are used, a video coder may update the contexts with a more favorable compromise between accuracy and adaption speed that using a fixed window size for all contexts. In this way, the techniques of this disclosure may improve the efficiency of CABAC, which may enable a video coder to reduce the number of bits needed to encode video data.

The techniques described in this disclosure may be performed, for example, within a video encoder, video decoder, or combined video encoder-decoder (CODEC). In particular, such techniques may be performed in an entropy encoding unit of a video encoder and/or an entropy decoding unit of a video decoder. The techniques may be performed, for example, within a CABAC process, which may be configured to support video coding, such as video coding according to aspects of the HEVC standard Entropy encoding and decoding units may be apply coding processes in a reciprocal or inverse manner, e.g., to encode or decode any of a variety of video data, such as quantized transform coefficients associated with residual video data, motion vector information, syntax elements, and other types of information that may be useful in a video encoding and/or video decoding process.

Figure 4:
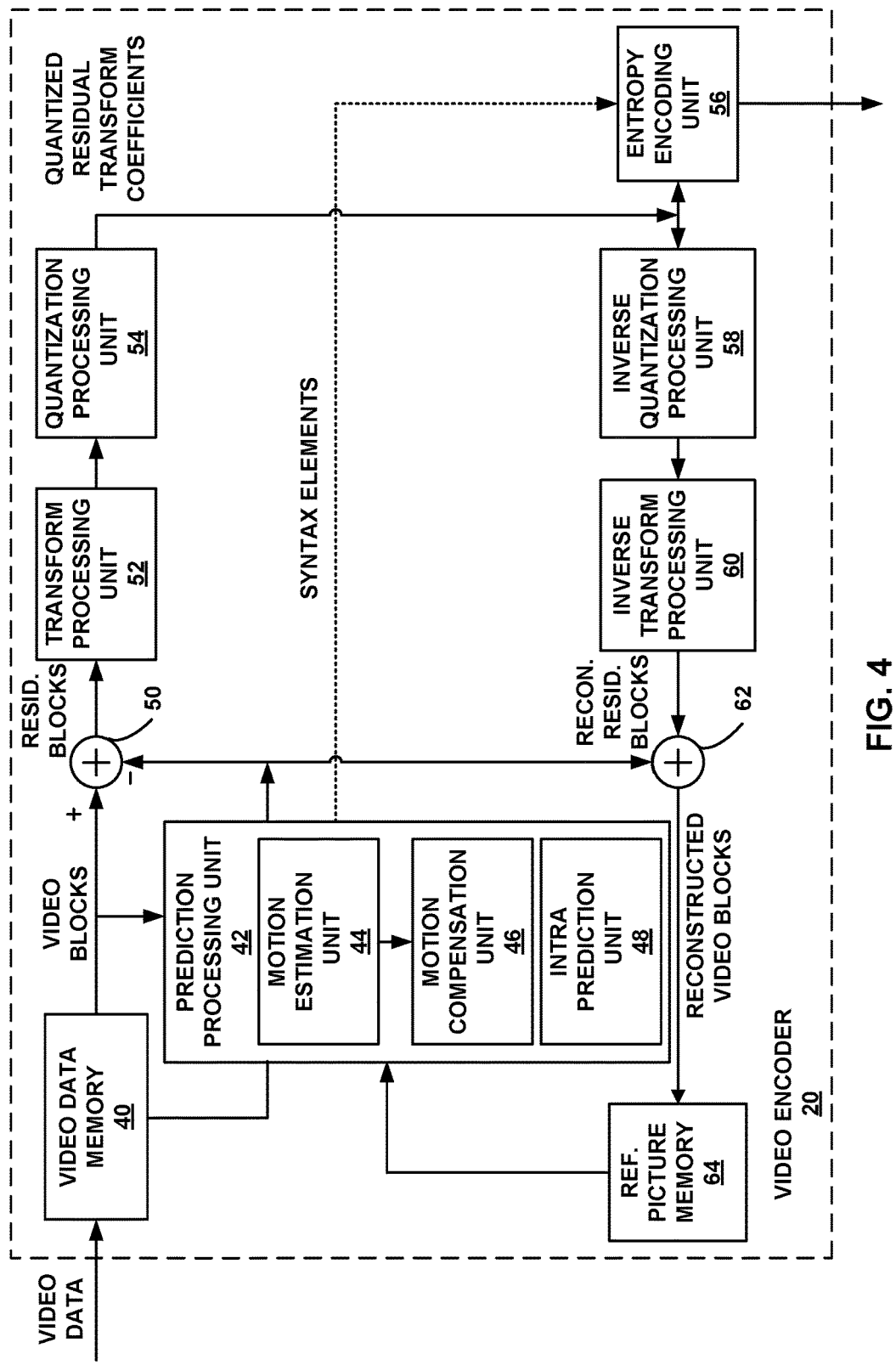
FIG. 4 is a block diagram illustrating an example video encoder.

FIG. 4 is a block diagram illustrating an example of a video encoder 20 that may be configured to utilize techniques for BAC coding, as described in this disclosure. The video encoder 20 will be described in the context of HEVC coding for purposes of illustration, but without limitation of this disclosure as to other coding standards or methods. Moreover, video encoder 20 may be configured to implement techniques in accordance with the range extensions of HEVC.

Video encoder 20 may perform intra- and inter-coding of video blocks within video slices. Intra-coding relies on spatial prediction to reduce or remove spatial redundancy in video within a given video picture. Inter-coding relies on temporal prediction or inter-view prediction to reduce or remove temporal redundancy in video within adjacent pictures of a video sequence or reduce or remove redundancy with video in other views.

In the example of FIG. 4, video encoder 20 includes video data memory 40, prediction processing unit 42, reference picture memory 64, summer 50, transform processing unit 52, quantization processing unit 54, and entropy encoding unit 56. Prediction processing unit 42, in turn, includes motion estimation unit 44, motion compensation unit 46, and intra-prediction unit 48. For video block reconstruction, video encoder 20 also includes inverse quantization processing unit 58, inverse transform processing unit 60, and summer 62. A deblocking filter (not shown in FIG. 4) may also be included to filter block boundaries to remove blockiness artifacts from reconstructed video. If desired, the deblocking filter would typically filter the output of summer 62. Additional loop filters (in loop or post loop) may also be used in addition to the deblocking filter.

Video data memory 40 may store video data to be encoded by the components of video encoder 20. The video data stored in video data memory 40 may be obtained, for example, from video source 18. Reference picture memory 64 is one example of a decoding picture buffer (DPB) that stores reference video data for use in encoding video data by video encoder 20 (e.g., in intra- or inter-coding modes, also referred to as intra- or inter-prediction coding modes). Video data memory 40 and reference picture memory 64 may be formed by any of a variety of memory devices, such as dynamic random access memory (DRAM), including synchronous DRAM (SDRAM), magnetoresistive RAM (MRAM), resistive RAM (RRAM), or other types of memory devices. Video data memory 40 and reference picture memory 64 may be provided by the same memory device or separate memory devices. In various examples, video data memory 40 may be on-chip with other components of video encoder 20, or off-chip relative to those components.

During the encoding process, video encoder 20 receives a video picture or slice to be coded. The picture or slice may be divided into multiple video blocks. Motion estimation unit 44 and motion compensation unit 46 perform inter-predictive coding of the received video block relative to one or more blocks in one or more reference pictures to provide temporal compression or provide inter-view compression. Intra-prediction unit 48 may alternatively perform intra-predictive coding of the received video block relative to one or more neighboring blocks in the same picture or slice as the block to be coded to provide spatial compression. Video encoder 20 may perform multiple coding passes (e.g., to select an appropriate coding mode for each block of video data).

Moreover, a partition unit (not shown) may partition blocks of video data into sub-blocks, based on evaluation of previous partitioning schemes in previous coding passes. For example, the partition unit may initially partition a picture or slice into LCUs, and partition each of the LCUs into sub-CUs based on rate-distortion analysis (e.g., rate-distortion optimization). Prediction processing unit 42 may further produce a quadtree data structure indicative of partitioning of an LCU into sub-CUs. Leaf-node CUs of the quadtree may include one or more PUs and one or more TUs.

Prediction processing unit 42 may select one of the coding modes, intra or inter, e.g., based on error results, and provides the resulting intra- or inter-coded block to summer 50 to generate residual block data and to summer 62 to reconstruct the encoded block for use as a reference picture. Prediction processing unit 42 also provides syntax elements, such as motion vectors, intra-mode indicators, partition information, and other such syntax information, to entropy encoding unit 56.

Motion estimation unit 44 and motion compensation unit 46 may be highly integrated, but are illustrated separately for conceptual purposes. Motion estimation, performed by motion estimation unit 44, is the process of generating motion vectors, which estimate motion for video blocks. A motion vector, for example, may indicate the displacement of a PU of a video block within a current video picture relative to a predictive block within a reference picture (or other coded unit) relative to the current block being coded within the current picture (or other coded unit). A predictive block is a block that is found to closely match the block to be coded, in terms of pixel difference, which may be determined by sum of absolute difference (SAD), sum of square difference (SSD), or other difference metrics. In some examples, video encoder 20 may calculate values for sub-integer pixel positions of reference pictures stored in reference picture memory 64. For example, video encoder 20 may interpolate values of one-quarter pixel positions, one-eighth pixel positions, or other fractional pixel positions of the reference picture. Therefore, motion estimation unit 44 may perform a motion search relative to the full pixel positions and fractional pixel positions and output a motion vector with fractional pixel precision.

Motion estimation unit 44 calculates a motion vector for a PU of a video block in an inter-coded slice by comparing the position of the PU to the position of a predictive block of a reference picture. The reference picture may be selected from one or more reference picture lists (RPLs) which identify one or more reference pictures stored in reference picture memory 64. Motion estimation unit 44 sends the calculated motion vector to entropy encoding unit 56 and motion compensation unit 46. In some examples, motion estimation unit 44 may send an indication of the selected reference picture to entropy encoding unit 56.

Motion compensation, performed by motion compensation unit 46, may involve fetching or generating the predictive block based on the motion vector determined by motion estimation unit 44. Again, motion estimation unit 44 and motion compensation unit 46 may be functionally integrated, in some examples. Upon receiving the motion vector for the PU of the current block, motion compensation unit 46 may locate the predictive block to which the motion vector points in one of the reference picture lists (RPLs). Summer 50 forms a residual video block by subtracting pixel values of the predictive block from the pixel values of the current block being coded, forming pixel difference values, as discussed below. In general, motion estimation unit 44 performs motion estimation relative to luma components, and motion compensation unit 46 uses motion vectors calculated based on the luma components for both chroma components and luma components. Prediction processing unit 42 may also generate syntax elements associated with the video blocks and the video slice for use by video decoder 30 in decoding the video blocks of the video slice.

Intra-prediction unit 48 may intra-predict a current block, as an alternative to the inter-prediction performed by motion estimation unit 44 and motion compensation unit 46, as described above. In particular, intra-prediction unit 48 may determine an intra-prediction mode to use to encode a current block. In some examples, intra-prediction unit 48 may encode blocks using various intra-prediction modes, e.g., during separate encoding passes, and intra-prediction unit 48 may select an appropriate intra-prediction mode to use from a plurality of intra-prediction modes.

For example, intra-prediction unit 48 may calculate rate-distortion values using a rate-distortion analysis for the various tested intra-prediction modes, and select the intra-prediction mode having the best rate-distortion characteristics among the tested modes. Rate-distortion analysis generally determines an amount of distortion (or error) between an encoded block and an original, unencoded block that was encoded to produce the encoded block, as well as a bitrate (that is, a number of bits) used to produce the encoded block. Intra-prediction unit 48 may calculate ratios from the distortions and rates for the various encoded blocks to determine which intra-prediction mode exhibits the best rate-distortion value for the block. In some examples, each of the plurality of intra-prediction modes may have a corresponding mode index, which may be signaled (i.e., to a video decoder) by intra-prediction unit 48.

Video encoder 20 forms a residual video block by subtracting the prediction data from prediction processing unit 42 from the original video block being coded. Summer 50 represents the component or components that perform this subtraction operation.

Transform processing unit 52 applies a transform, such as a discrete cosine transform (DCT) or a conceptually similar transform, to the residual block, producing a video block comprising residual transform coefficient values. Transform processing unit 52 may perform other transforms which are conceptually similar to DCT. Wavelet transforms, integer transforms, sub-band transforms or other types of transforms could also be used. In any case, transform processing unit 52 applies the transform to the residual block, producing a block of residual transform coefficients. The transform may convert the residual information from a pixel value domain to a transform domain, such as a frequency domain.

Transform processing unit 52 may send the resulting transform coefficients to quantization processing unit 54. Quantization processing unit 54 quantizes the transform coefficients to further reduce bit rate. The quantization process may reduce the bit depth associated with some or all of the coefficients. The degree of quantization may be modified by adjusting a quantization parameter. In some examples, quantization processing unit 54 may then perform a scan of the matrix including the quantized transform coefficients. Alternatively, entropy encoding unit 56 may perform the scan.

Once the transform coefficients are scanned into the one-dimensional array, the entropy encoding unit 56 may apply entropy coding such as context-adaptive variable length coding (CAVLC), context-adaptive binary arithmetic coding (CABAC), probability interval partitioning entropy coding (PIPE), Golomb coding, Golomb-Rice coding, exponential Golomb coding, syntax-based context-adaptive binary arithmetic coding (SBAC), or another entropy coding methodology to the coefficients. Although reference is made to a variety of different entropy coding processes, in accordance with examples of this disclosure, entropy encoding unit 56 may be configured to perform BAC coding as described above.

To perform CAVLC, the entropy encoding unit 56 may select a variable length code for a symbol to be transmitted. Codewords in VLC may be constructed such that relatively shorter codes correspond to more likely symbols, while longer codes correspond to less likely symbols. In this way, the use of VLC may achieve a bit savings over, for example, using equal-length codewords for each symbol to be transmitted.

To perform CABAC, the entropy encoding unit 56 may select a context to apply to a certain context to encode symbols to be transmitted. The context may relate to, for example, whether neighboring values are non-zero or not. The entropy encoding unit 56 may also entropy encode syntax elements, such as the signal representative of the selected transform. Following the entropy coding by the entropy encoding unit 56, the resulting encoded video may be transmitted to another device, such as the video decoder 30, or archived for later transmission or retrieval.

In accordance with one or more techniques of this disclosure, entropy encoding unit 56 may select different window sizes when entropy encoding data (e.g., syntax element values represented as a one-dimensional binary vector) for use by a video decoder, such as video decoder 30, in decoding the video data. Further details of one example of entropy encoding unit 56 are discussed below with reference to FIG. 5.

Inverse quantization processing unit 58 and inverse transform processing unit 60 apply inverse quantization and inverse transformation, respectively, to reconstruct the residual block in the pixel domain, e.g., for later use as a reference block.

Motion compensation unit 46 may also apply one or more interpolation filters to the reference block to calculate sub-integer pixel values for use in motion estimation. Summer 62 adds the reconstructed residual block to the motion compensated prediction block produced by motion compensation unit 46 to produce a reconstructed video block for storage in reference picture memory 64. The reconstructed video block may be used by motion estimation unit 44 and motion compensation unit 46 as a reference block to inter-code a block in a subsequent video picture. In some examples, such as where the current picture is used as a reference picture to predict the current picture, motion compensation unit 46 and/or summer 62 may update the version of the current picture stored by reference picture memory 64 at regular intervals while coding the current picture. As one example, motion compensation unit 46 and/or summer 62 may update the version of the current picture stored by reference picture memory 64 after coding each block of the current picture. For instance, where the samples of the current block are stored in reference picture memory 64 as initialized values, motion compensation unit 46 and/or summer 62 may update the samples of the current of the current picture stored by reference picture memory 64 with the reconstructed samples for the current block.

A filtering unit (not shown) may perform a variety of filtering processes. For example, the filtering unit may perform deblocking. That is, the filtering unit may receive a plurality of reconstructed video blocks forming a slice or a frame of reconstructed video and filter block boundaries to remove blockiness artifacts from a slice or frame. In one example, the filtering unit evaluates the so-called "boundary strength" of a video block. Based on the boundary strength of a video block, edge pixels of a video block may be filtered with respect to edge pixels of an adjacent video block such that the transition from one video block are more difficult for a viewer to perceive.

In some examples, motion compensation unit 46 and/or summer 62 may update the version of the current picture stored by reference picture memory 64 before the filtering performs the filtering (e.g., deblocking and/or SAO) to the samples. For instance, the filtering unit may wait until the whole picture is coded before applying the filtering. In this way, motion estimation unit 44 may use the current picture as a reference before applying the filtering. In some examples, the filtering unit may perform the filtering as the version of the current picture stored by reference picture memory 64 is updated. For instance, the filtering unit may apply the filtering as each block is updated. In this way, motion estimation unit 44 may use the current picture as a reference after applying the filtering.

While a number of different aspects and examples of the techniques are described in this disclosure, the various aspects and examples of the techniques may be performed together or separately from one another. In other words, the techniques should not be limited strictly to the various aspects and examples described above, but may be used in combination or performed together and/or separately. In addition, while certain techniques may be ascribed to certain units of video encoder 20 (such as intra prediction unit 48, motion compensation unit 46, or entropy encoding unit 56) it should be understood that one or more other units of video encoder 20 may also be responsible for carrying out such techniques.

Figure 5:
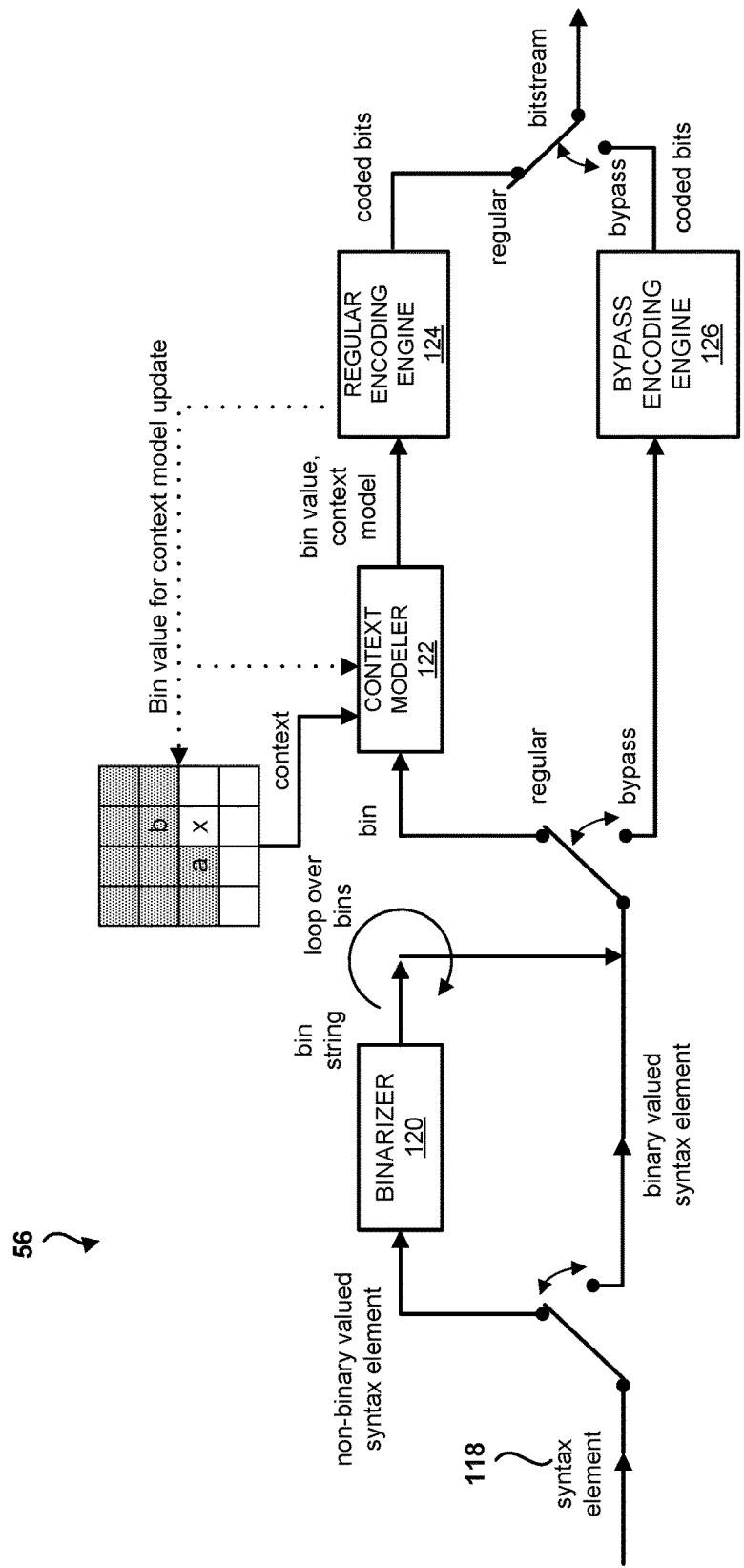
FIG. 5 is a block diagram illustrating a context adaptive binary arithmetic coder in a video encoder.

FIG. 5 is a block diagram of an example entropy encoding unit 56 that may be configured to perform CABAC in accordance with the techniques of this disclosure. A syntax element 118 is input into the entropy encoding unit 56. If the syntax element is already a binary-value syntax element (e.g., a flag or other syntax element that only has a value of 0 and 1), the step of binarization may be skipped. If the syntax element is a non-binary valued syntax element (e.g., a syntax element that may have values other than 1 or 0), the non-binary valued syntax element is binarized by binarizer 120. Binarizer 120 performs a mapping of the non-binary valued syntax element into a sequence of binary decisions. These binary decisions are often called "bins." For example, for transform coefficient levels, the value of the level may be broken down into successive bins, each bin indicating whether or not the absolute value of coefficient level is greater than some value. For example, bin 0 (sometimes called a significance flag) indicates if the absolute value of the transform coefficient level is greater than 0 or not. Bin 1 indicates if the absolute value of the transform coefficient level is greater than 1 or not, and so on. A unique mapping may be developed for each non-binary valued syntax element.

Each bin produced by binarizer 120 is fed to the binary arithmetic coding side of entropy encoding unit 56. That is, for a predetermined set of non-binary valued syntax elements, each bin type (e.g., bin 0) is coded before the next bin type (e.g., bin 1). Coding may be performed in either regular mode or bypass mode. In bypass mode, bypass coding engine 126 performs arithmetic coding using a fixed probability model, for example, using Golomb-Rice or exponential Golomb coding. Bypass mode is generally used for more predictable syntax elements.

Coding in regular mode involves performing CABAC. Regular mode CABAC is for coding bin values where the probability of a value of a bin is predictable given then values of previously coded bins. The probability of a bin being an LPS is determined by context modeler 122. Context modeler 122 outputs the bin value and the probability state for the context (e.g., the probability state σ, including the value of the LPS and the probability of the LPS occurring). The context may be an initial context for a series of bins, or may be determined based on the coded values of previously coded bins. As described above, context modeler 122 may update the state based on whether or not the received bin was the MPS or the LPS. After the context and probability state σ is determined by context modeler 122, regular coding engine 124 performs BAC on the bin value.

In accordance with one or more techniques of this disclosure, as opposed to using the same value of a variable used to update a probability state in a binary arithmetic coding process (e.g., one or more of a window size, or a scaling factor (α), or a fixed probability updating speed), entropy encoding unit 56 may use different values of the variable for different contexts and/or different syntax elements. For instance, context modeler 122 may determine, for a context of a plurality of context, a value of a variable used to update a probability state in a binary arithmetic coding process, and update the probability state based on the determined value.

In some examples, the window size used by context modeler 122 to determine the next probability state may be made dependent on context. For instance, context modeler 122 may use different window sizes for different contexts. As one example, context modeler 122 may determine a first window size for a first context of a plurality of contexts and determine a second window size for a second context of the plurality of contexts that is different than the first window size.

In some examples, when incorporating the above context dependent updating method to the counter-based arithmetic coders, such as in JCTVC-F254 and JCTV-G764, the value of window size may be dependent on context. In addition, each context may be further associated with a window size in addition to the probability Pi from Equation (4).

In some examples, context modeler 122 may use window sizes W that may be equal to $2^M$, where M may be a positive integer. Therefore, each context may have its own M value, which may be different from other contexts, though some context models may have the same M value.

In some examples, context modeler 122 may determine the windows sizes from a pre-defined set of window sizes. Some example predefined window sizes are 16, 32, 64, and 128, though other window sizes are contemplated. For instance, a set of possible M values may be pre-defined, e.g., M could range from 4 to 7, inclusive. In some examples, context modeler 122 may cause an indication of the set of possible window sizes (e.g., an indication of a set of possible M values) to be signaled in a slice header or a parameter set, including a picture parameter set, an active parameter set, a sequence parameter set, or a video parameter set.

In some examples, the window sizes (e.g., values of M) associated with each context may be pre-defined. In some examples, the window sizes may be further dependent on the slice types and/or temporal identifiers (e.g., referred to as temporalId in HEVC). In some examples, the window sizes may be further dependent on the picture types (or NAL unit types), e.g., whether a picture is a random access picture or not.

In some examples, context modeler 122 may cause the window sizes (e.g., values of M) associated with each context to be signaled in the bitstream, such as in slice header/picture parameter set/active parameter set/sequence parameter set. For instance, a default window size for each context may be firstly pre-defined. For each respective context model, context modeler 122 may encode a respective syntax element (e.g., a flag) that indicates whether the default window size is used for the respective context. If the default window size is not used for a respective context, context modeler 122 may differentially encode the actual used window size based on the default window size. In some examples, context modeler 122 may organize the syntax elements (i.e., that indicate whether the default window size is used) of all contexts together, and utilize run-length coding to code these syntax elements. In some examples, context modeler 122 may utilize a mapping table when coding the difference between the actually used window size and the default window size. For example, where the default M value is equal to 6, the possible M values are 4, 5, 6, and 7. The mapping table may be defined as:

| Actual M value | 4 | 5 | 6 | 7 |
|---|---|---|---|---|
| Value to be coded | 0 | 1 | — | 2 |

In some examples, context modeler 122 may directly code the difference between the actual window size and the default window size for each context. For instance, where the default M value is 4, context modeler 122 may code M−4 for each context.

In some examples, context modeler 122 may code a first syntax element that indicates whether all window sizes for contexts in a current slice are inherited (i.e., set equal to) window sizes for corresponding contexts in a previously coded slice. In one example, the "previously decoded slice" may be defined as the previously coded slices which have the same slice type, or both the same slice type and quantization parameter, or both the same slice type and temporal layer, as the current slice and/or the same initialized quantization parameters. In some examples, the previous slice may be required to belong to a picture that is present in the DPB and may be used for the current picture as a reference picture, in particular, as in HEVC based platform, the previous slice may be required to belong to a picture in reference picture set (RPS), or even a picture in one of the following subsets of the RPS: RefPicSetStCurrBefore, RefPicSetStCurrAfter, and RefPicSetLtCurr.

In some examples, context modeler 122 may code a first syntax element that indicates whether a default window size is used for a plurality of contexts (e.g., in a current slice). Where the default window size is not used for the plurality of contexts, context modeler 122 may code a second syntax element that indicates the window size for the context. For instance, context modeler 122 may code a second syntax element that indicates a difference between the window size for the context and the default window size.

In another example, context modeler 122 may derive the window sizes, e.g., based on coded information from previous slices or pictures. For instance, context modeler 122 may track the coded bins in a previous slice associated with one context. For each candidate of possible window sizes, context modeler 122 may obtain the bits consumed for coding these bins, and select the window size which results in the minimum bits for coding these bins as the window size for this context. Context modeler 122 may use the selected window size for coding the following slices/pictures.

In some examples, the 'window size' used to determine the next probability state or probability update speed in arithmetic coders may be syntax element specific, e.g., where the context is shared among different syntax elements. For instance, when using a context to encode a bin of a syntax element, context modeler 122 may determine the window size for the context based on the syntax element. As one example, the window size used to update a state of a context when coding bins of the coding unit split syntax element and coding unit skip flag syntax element may be the same, e.g.,16 (i.e., M=4).

In accordance with one or more techniques of this disclosure, context modeler 122 may adaptively determine different window sizes when entropy encoding data (e.g., syntax elements representing the one-dimensional vector and/or other syntax elements) for use by video decoder 30 in decoding the video data. For instance, for each context, context modeler 122 may calculate the bits of coding a recorded bin string with different window sizes and select the one with minimum bit. Where the window sizes are selected from a pre-defined set of window sizes, context modeler 122 may determine, for respective window sizes of a pre-defined set of window sizes, respective quantities of bits used to encode a bin string with a context, and select the window size of the pre-defined set of window sizes that corresponds to the smallest quantity of bits as the window size for the context.

In some examples, the above technique(s) may be applicable to specific contexts. That is, a subset of the contexts may use the updated 'window sizes' rather than the default one. In some examples, the above technique(s) may be applicable to specific slice types.

Returning to FIG. 4, in some cases, the entropy encoding unit 56 or another unit of video encoder 20 may be configured to perform other coding functions, in addition to entropy coding. For example, entropy encoding unit 56 may be configured to determine coded block pattern (CBP) values for CU's and PU's. Also, in some cases, entropy encoding unit 56 may perform run length coding of coefficients. In addition, entropy encoding unit 56, or other processing units, also may code other data, such as the values of a quantization matrix.

As discussed above, inverse quantization unit 58 and inverse transform processing unit 60 apply inverse quantization and inverse transformation, respectively, to reconstruct the residual block in the pixel domain, e.g., for later use as a reference block. Motion compensation unit 46 may calculate a reference block by adding the residual block to a predictive block of one of the frames of the reference frame memory 64. Motion compensation unit 46 may also apply one or more interpolation filters to the reconstructed residual block to calculate sub-integer pixel values for use in motion estimation. Summer 62 adds the reconstructed residual block to the motion compensated prediction block produced by motion compensation unit 46 to produce a reconstructed video block for storage in reference frame memory 64. The reconstructed video block may be used by motion estimation unit 44 and the motion compensation unit 46 as a reference block to inter-code a block in a subsequent video frame.

Figure 6:
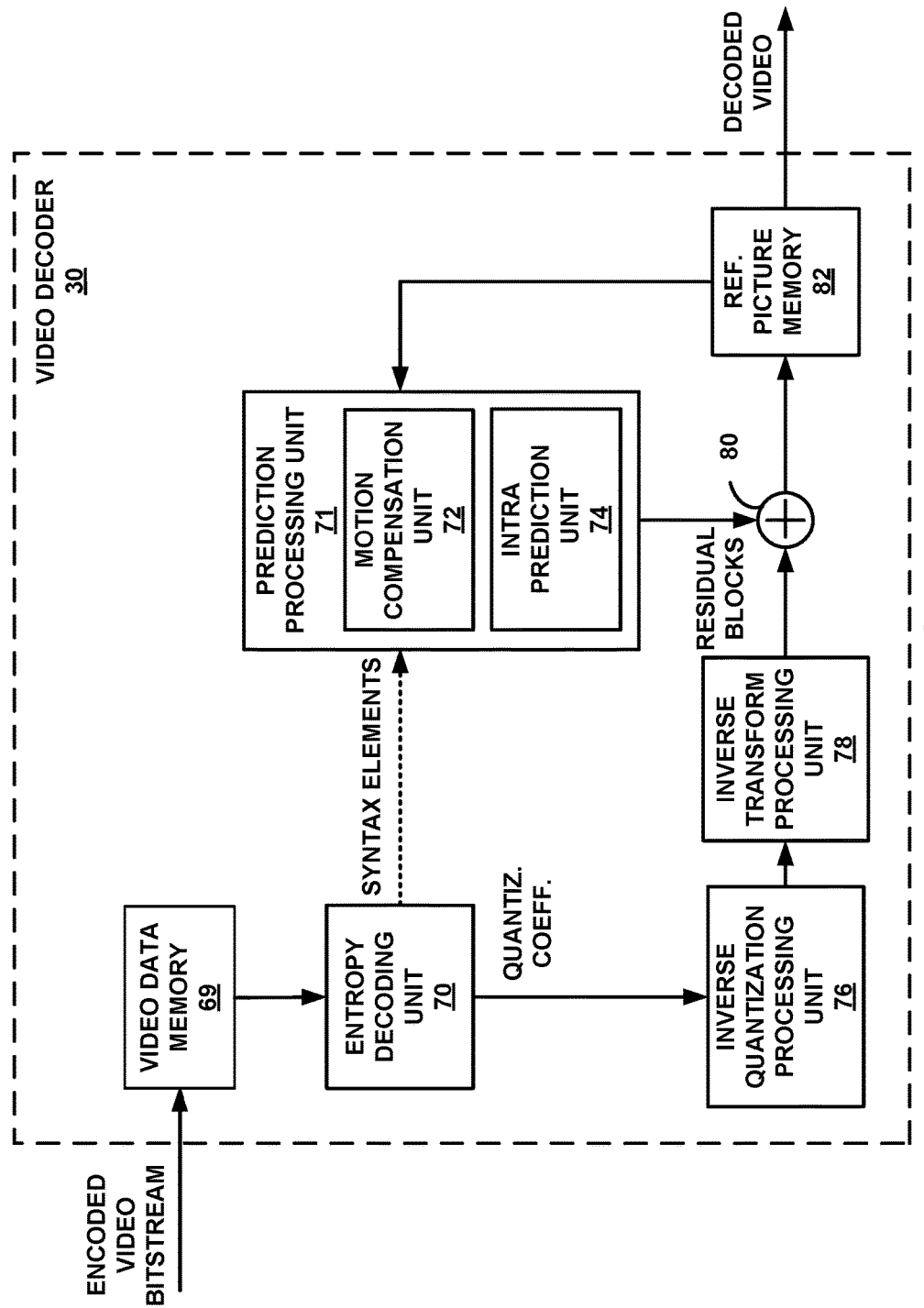
FIG. 6 is a block diagram illustrating an example video decoder.

FIG. 6 is a block diagram illustrating an example of video decoder 30 that may implement techniques described in this disclosure. Again, the video decoder 30 will be described in the context of HEVC coding for purposes of illustration, but without limitation of this disclosure as to other coding standards. Moreover, video decoder 30 may be configured to implement techniques in accordance with the range extensions.

In the example of FIG. 6, video decoder 30 may include video data memory 69, entropy decoding unit 70, prediction processing unit 71, inverse quantization processing unit 76, inverse transform processing unit 78, summer 80, and reference picture memory 82. Prediction processing unit 71 includes motion compensation unit 72 and intra prediction unit 74. Video decoder 30 may, in some examples, perform a decoding pass generally reciprocal to the encoding pass described with respect to video encoder 20 from FIG. 4.

Video data memory 69 may store video data, such as an encoded video bitstream, to be decoded by the components of video decoder 30. The video data stored in video data memory 69 may be obtained, for example, from storage device 34, from a local video source, such as a camera, via wired or wireless network communication of video data, or by accessing physical data storage media. Video data memory 69 may form a coded picture buffer (CPB) that stores encoded video data from an encoded video bitstream.

Reference picture memory 82 is one example of a decoded picture buffer (DPB) that stores reference video data for use in decoding video data by video decoder 30 (e.g., in intra- or inter-coding modes). Video data memory 69 and reference picture memory 82 may be formed by any of a variety of memory devices, such as dynamic random access memory (DRAM), including synchronous DRAM (SDRAM), magnetoresistive RAM (MRAM), resistive RAM (RRAM), or other types of memory devices. Video data memory 69 and reference picture memory 82 may be provided by the same memory device or separate memory devices. In various examples, video data memory 69 may be on-chip with other components of video decoder 30, or off-chip relative to those components.

During the decoding process, video decoder 30 receives an encoded video bitstream that represents video blocks of an encoded video slice and associated syntax elements from video encoder 20. Entropy decoding unit 70 of video decoder 30 entropy decodes the bitstream to generate quantized coefficients, motion vectors or intra-prediction mode indicators, and other syntax elements. In some examples, entropy decoding unit 70 may apply a process that is generally inverse to the process used by the encoder. Entropy decoding unit 70 performs an entropy decoding process on the encoded bitstream to retrieve a one-dimensional array of transform coefficients. The entropy decoding process used depends on the entropy coding used by the video encoder 20 (e.g., CABAC, CAVLC, PIPE, or other processes described above). In accordance with the techniques described in this disclosure, entropy decoding unit 70 may apply a BAC process, e.g., within a CABAC process, as described in this disclosure. The window sizes in the entropy coding process used by the encoder may be signaled in the encoded bitstream or may be a predetermined process.

Entropy decoding unit 70 forwards the motion vectors to and other syntax elements to motion compensation unit 72. Video decoder 30 may receive the syntax elements at the video slice level and/or the video block level.

Figure 7:
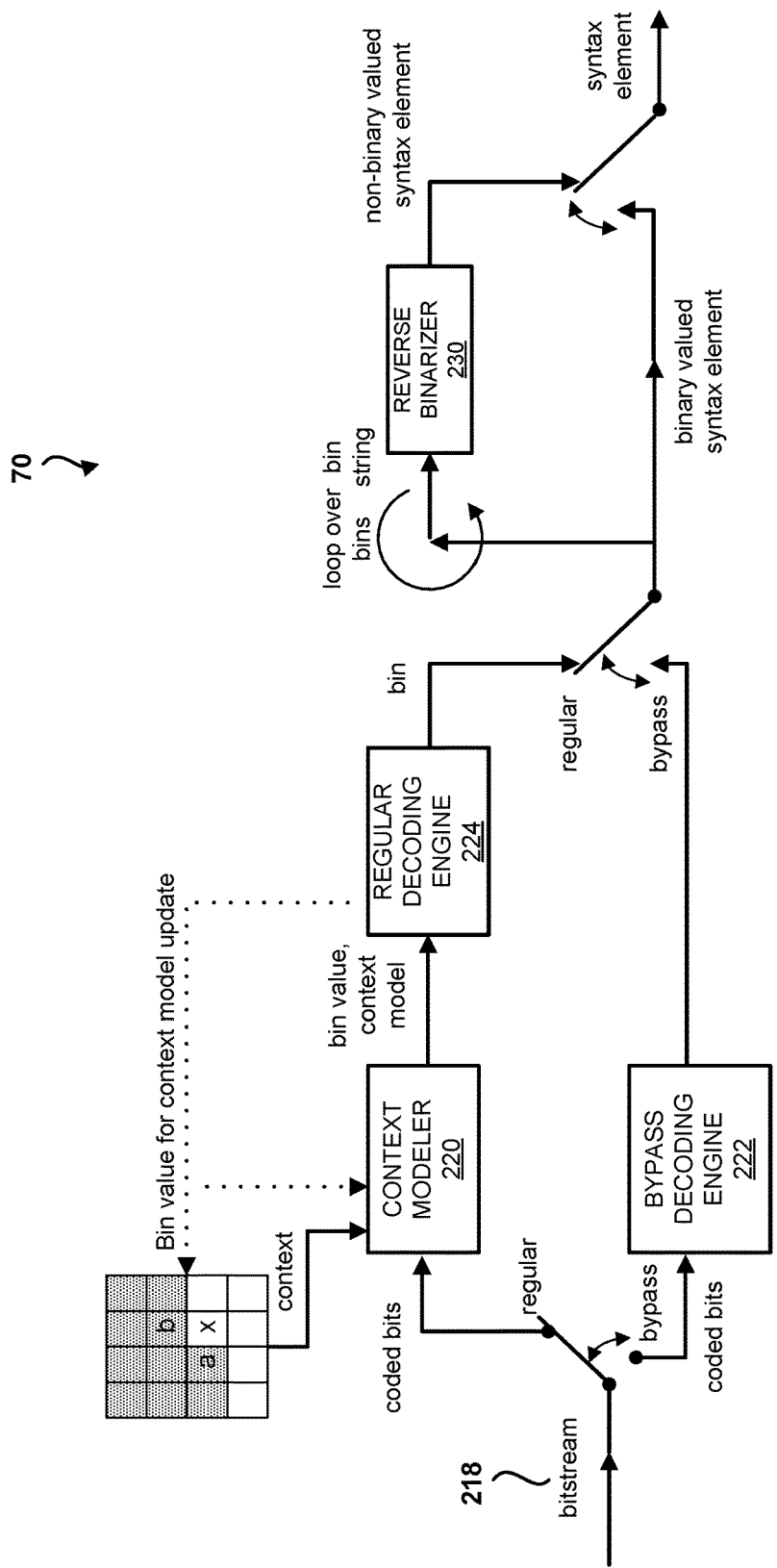
FIG. 7 is a block diagram illustrating a context adaptive binary arithmetic coder in a video decoder.

FIG. 7 is a block diagram of an example entropy decoding unit 70 that may be configured to perform CABAC in accordance with the techniques of this disclosure. The entropy decoding unit 70 of FIG. 7 performs CABAC in an inverse manner as that of entropy encoding unit 56 described in FIG. 5. Coded bits from bitstream 218 are input into entropy decoding unit 70. The coded bits are fed to either context modeler 220 or bypass coding engine 222 based on whether or not they were entropy coded using bypass mode or regular mode. If the coded bits were coded in bypass mode, bypass decoding engine will use Golomb-Rice or exponential Golomb decoding, for example, to retrieve the binary-valued syntax elements or bins of non-binary syntax elements.

If the coded bits were coded in regular mode, context modeler 220 may determine a probability model for the coded bits and regular decoding engine 224 may decode the coded bits to produce bins of non-binary valued syntax elements (or the syntax elements themselves if binary-valued). After the context and probability state σ is determined by context modeler 220, regular decoding engine 224 performs BAC to decode the bin value. In other words, regular decoding engine 224 may determine a probability state of a context, and decode a bin value based on previously coded bins and a current range. After decoding the bin, context modeler 220 may update the probability state of the context based on the window size and the value of the decoded bin.

In accordance with one or more techniques of this disclosure, as opposed to using the same value of a variable used to update a probability state in a binary arithmetic coding process (e.g., one or more of a window size, a scaling factor (a), and a fixed probability updating speed), entropy encoding unit 56 may use different values of the variable for different contexts and/or different syntax elements. For instance, context modeler 220 may determine, for a context of a plurality of contexts, a value of a variable used to update a probability state in a binary arithmetic coding process, and update the probability state based on the determined value.

In some examples, the window size used by context modeler 220 to determine the next probability state may be made dependent on context. For instance, context modeler 220 may use different window sizes for different contexts. As one example, context modeler 220 may determine a first window size for a first context of a plurality of contexts and determine a second window size for a second context of the plurality of contexts that is different than the first window size.

In some examples, when incorporating the above context-model dependent updating method to the counter-based arithmetic coders, such as in JCTVC-F254 and JCTV-G764, the value of window size may be dependent on context. In addition, each context may be further associated with a window size in addition to the probability Pi from Equation (4).

In some examples, context modeler 220 may use window sizes W that may be equal to $2^M$, where M may be a positive integer. Therefore, each context may have its own M value which may be different from other contexts, though some contexts may have the same M value.

In some examples, context modeler 220 may determine the windows sizes from a pre-defined set of window sizes. For instance, a set of possible M values may be pre-defined, e.g., M could range from 4 to 7, inclusive. In some examples, entropy decoding unit 70 may decode an indication of the set of possible window sizes (e.g., an indication of a set of possible M values) from a slice header or a parameter set, including a picture parameter set, an active parameter set, a sequence parameter set, or a video parameter set.

In some examples, the window sizes (e.g., values of M) associated with each context may be pre-defined. In some examples, the window sizes may be further dependent on the slice types and/or temporal identifiers (e.g., referred to as temporalId in HEVC). In some examples, the window sizes may be further dependent on the picture types (or NAL unit types), e.g., whether a picture is a random access picture or not.

In some examples, entropy decoding unit 70 may decode the window sizes (e.g., values of M) associated with each context from the bitstream, such as in slice header/picture parameter set/active parameter set/sequence parameter set. For instance, a default window size for each context may be firstly pre-defined. For each respective context, entropy decoding unit 70 may decode a respective syntax element (e.g., a flag) that indicates whether the default window size is used for the respective context. If the default window size is not used for a respective context, entropy decoding unit 70 may differentially decode the actual used window size based on the default window size. In some examples, the syntax elements (i.e., that indicate whether the default window size is used) of all contexts may be organized together, and entropy decoding unit 70 may utilize run-length coding to decode these syntax elements. In some examples, context modeler 220 may utilize a mapping table when coding the difference between the actually used window size and the default window size. For example, where the default M value is equal to 6, the possible M values are 4, 5, 6, and 7. The mapping table may be defined as:

| Actual M value | 4 | 5 | 6 | 7 |
|---|---|---|---|---|
| Value to be coded | 0 | 1 | — | 2 |

In some examples, entropy decoding unit 70 may directly decode the difference between the actual window size and the default window size for each context. For instance, where the default M value is 4, entropy decoding unit 70 may decode the value of M−4 for each context.

In some examples, entropy decoding unit 70 may decode a first syntax element that indicates whether all window sizes for contexts in a current slice are inherited (i.e., set equal to) window sizes for corresponding contexts in a previously coded slice. In one example, the "previously decoded slice" may be defined as the previously coded slices which have the same slice type, or both the same slice type and quantization parameter, or both the same slice type and temporal layer, as the current slice and/or the same initialized quantization parameters. In some examples, the previous slice may be required to belong to a picture that is present in the DPB and may be used for the current picture as a reference picture, in particular, as in HEVC based platform, the previous slice may be required to belong to a picture in reference picture set (RPS), or even a picture in one of the following subsets of the RPS: RefPicSetStCurrBefore, RefPicSetStCurrAfter, and RefPicSetLtCurr.

In some examples, entropy decoding unit 70 may decode a first syntax element that indicates whether a default window size is used for a plurality of contexts (e.g., in a current slice). Where the default window size is not used for the plurality of contexts, entropy decoding unit 70 may decode a second syntax element that indicates the window size for the context. For instance, entropy decoding unit 70 may decode a second syntax element that indicates a difference between the window size for the context and the default window size.

In another example, entropy decoding unit 70 may derive the window sizes, e.g., based on coded information from previous slices or pictures. For instance, entropy decoding unit 70 may track the decoded bins in a previous slice associated with one context is tracked. For each candidate of possible window sizes, entropy decoding unit 70 may obtain the bits consumed for coding these bins. Entropy decoding unit 70 may select the window size which results in the minimum bits for coding these bins as the window size for this context. Entropy decoding unit 70 may use the selected window size for decoding the following slices/pictures.

In some examples, the 'window size' used to determine the next probability state or probability update speed in arithmetic coders may be syntax element specific. For instance, when using a context to encode a bin of a syntax element, context modeler 220 may determine the window size for the context based on a type the syntax element. As one example, the window size used to update a context when coding bins of the coding unit split syntax element and coding unit skip flag syntax element may be the same, e.g., 16 (i.e., M=4).

In some examples, the above technique(s) may be applicable to specific contexts. That is, a subset of the contexts may use the updated 'window sizes' rather than the default one. In some examples, the above technique(s) may be applicable to specific slice types.

After the bins are decoded by regular decoding engine 224, a reverse binarizer 230 may perform a reverse mapping to convert the bins back into the values of the non-binary valued syntax elements.

Returning to FIG. 6, in some examples, the entropy decoding unit 70 (or the inverse quantization unit 76) may scan the received values using a scan mirroring the scanning mode used by the entropy encoding unit 56 (or the quantization unit 54) of the video encoder 20. Although the scanning of coefficients may be performed in the inverse quantization unit 76, scanning will be described for purposes of illustration as being performed by the entropy decoding unit 70. In addition, although shown as separate functional units for ease of illustration, the structure and functionality of the entropy decoding unit 70, the inverse quantization unit 76, and other units of the video decoder 30 may be highly integrated with one another.

Inverse quantization unit 76 inverse quantizes, i.e., de-quantizes, the quantized transform coefficients provided in the bitstream and decoded by the entropy decoding unit 70. The inverse quantization process may include a conventional process, e.g., similar to some examples of HEVC or defined by the H.264 decoding standard. The inverse quantization process may include use of a quantization parameter QP calculated by video encoder 20 for the CU to determine a degree of quantization and, likewise, a degree of inverse quantization that should be applied. Inverse quantization unit 76 may inverse quantize the transform coefficients either before or after the coefficients are converted from a one-dimensional array to a two-dimensional array.

Inverse transform processing unit 78 applies an inverse transform to the inverse quantized transform coefficients. In some examples, the inverse transform processing unit 78 may determine an inverse transform based on signaling from the video encoder 20, or by inferring the transform from one or more coding characteristics such as block size, coding mode, or the like. In some examples, the inverse transform processing unit 78 may determine a transform to apply to the current block based on a signaled transform at the root node of a quadtree for an LCU including the current block. Alternatively, the transform may be signaled at the root of a TU quadtree for a leaf-node CU in the LCU quadtree. In some examples, the inverse transform processing unit 78 may apply a cascaded inverse transform, in which inverse transform processing unit 78 applies two or more inverse transforms to the transform coefficients of the current block being decoded.

In addition, the inverse transform processing unit may apply the inverse transform to produce a transform unit partition in accordance with the above-described techniques of this disclosure.

The intra-prediction processing unit 74 may generate prediction data for a current block of a current frame based on a signaled intra-prediction mode and data from previously decoded blocks of the current frame. Based on the retrieved motion prediction direction, reference frame index, and calculated current motion vector (e.g., a motion vector copied from a neighboring block according to a merge mode), the motion compensation unit produces a motion compensated block for the current portion. These motion compensated blocks essentially recreate the predictive block used to produce the residual data.

The motion compensation unit 72 may produce the motion compensated blocks, possibly performing interpolation based on interpolation filters. Identifiers for interpolation filters to be used for motion estimation with sub-pixel precision may be included in the syntax elements. The motion compensation unit 72 may use interpolation filters as used by the video encoder 20 during encoding of the video block to calculate interpolated values for sub-integer pixels of a reference block. The motion compensation unit 72 may determine the interpolation filters used by the video encoder 20 according to received syntax information and use the interpolation filters to produce predictive blocks.

Additionally, the motion compensation unit 72 and the intra-prediction processing unit 74, in an HEVC example, may use some of the syntax information (e.g., provided by a quadtree) to determine sizes of LCUs used to encode frame(s) of the encoded video sequence. The motion compensation unit 72 and the intra-prediction processing unit 74 may also use syntax information to determine split information that describes how each CU of a frame of the encoded video sequence is split (and likewise, how sub-CUs are split). The syntax information may also include modes indicating how each split is encoded (e.g., intra- or inter-prediction, and for intra-prediction an intra-prediction encoding mode), one or more reference frames (and/or reference lists containing identifiers for the reference frames) for each inter-encoded PU, and other information to decode the encoded video sequence.

The summer 80 combines the residual blocks with the corresponding prediction blocks generated by the motion compensation unit 72 or the intra-prediction processing unit 74 to form decoded blocks. If desired, a deblocking filter may also be applied to filter the decoded blocks in order to remove blockiness artifacts. The decoded video blocks are then stored in the reference picture memory 82, which provides reference blocks for subsequent motion compensation and also produces decoded video for presentation on a display device (such as the display device 31 of FIG. 1).

Figure 8:
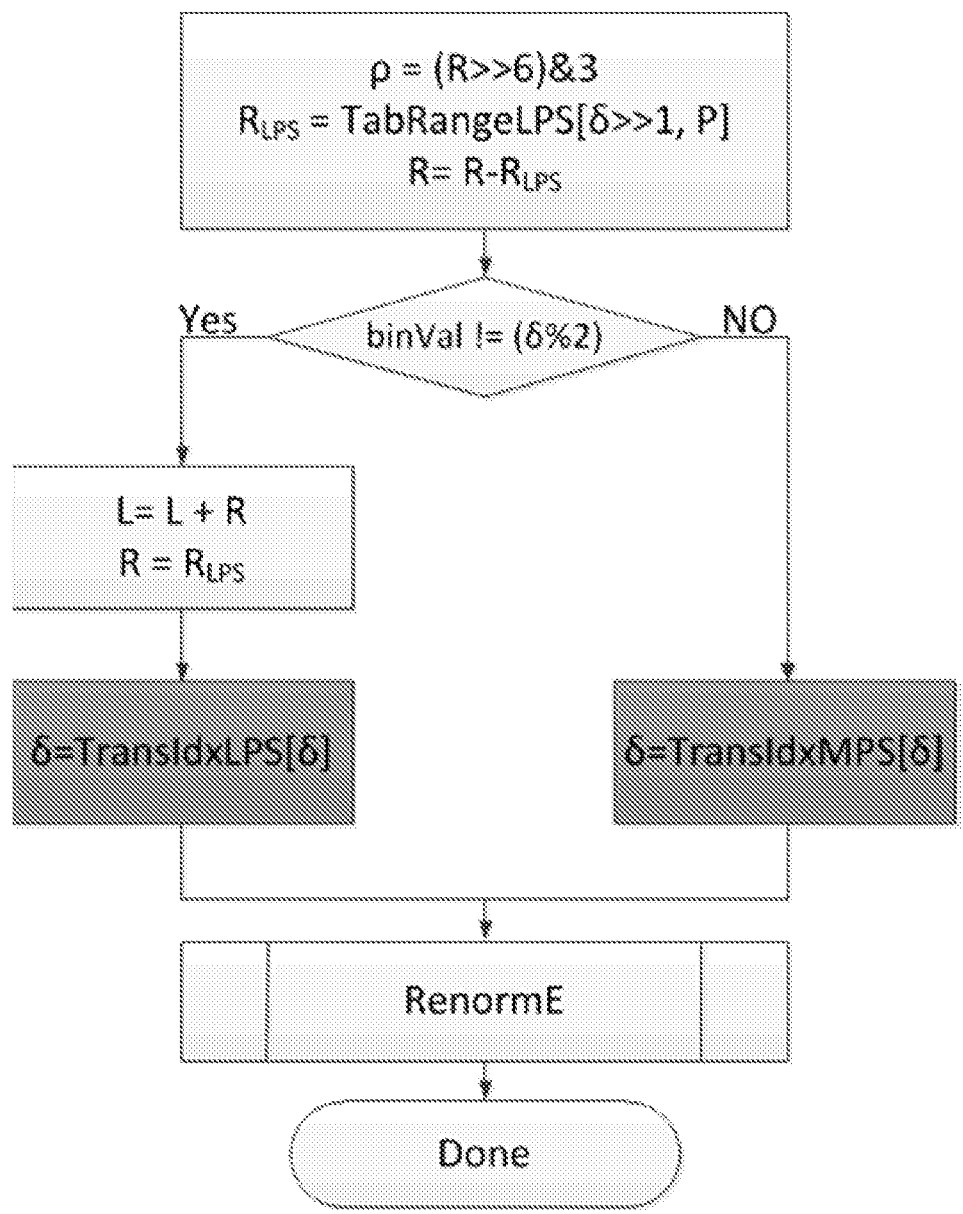
FIG. 8 illustrates a binary arithmetic encoding process for a given bin value using a regular coding mode.

FIG. 8 illustrates the binary arithmetic encoding process for a given bin value binVal using the regular coding mode. The internal state of the arithmetic encoding engine is as usual characterized by two quantities: the current interval range R and the base (lower endpoint) L of the current code interval. Note, however, that the precision needed to store these registers in the CABAC engine (both in regular and bypass mode) can be reduced up to 9 and 10 bits, respectively. Encoding of the given binary value binVal observed in a context with probability state index $\delta$ and value of MPS ($\delta$ %2) is performed in a sequence of four elementary steps as follows.

In the first and major step, the current interval is subdivided according to the given probability estimates. This interval subdivision process involves three elementary operations as shown in the topmost box of the flow diagram in FIG. 8. First, the current interval range R is approximated by a quantized value Q(R) using an equi-partition of the whole range $2^8 \leq R \leq 2^9$ into four cells. But instead of using the corresponding representative quantized range values $Q_0$, $Q_1$, $Q_2$, and $Q_3$ explicitly in the CABAC engine, is only addressed by its quantizer index $\rho$, which can be efficiently computed by a combination of a shift and bit-masking operation, i.e., in accordance with Equation (14), below.

$$\rho = (R >> 6) \& 3 \quad (14)$$

Then, this index $\rho$ and the probability state index $\delta$ are used as entries in a 2-D table TabRangeLPS to determine the (approximate) LPS related subinterval range $R_{LPS}$, as shown in FIG. 8. Here, the table TabRangeLPS contains all 64×4 pre-computed product values for $p_\sigma \cdot Q_\rho$ for $0 \leq (\delta >> 1) < 63$ and $0 \leq \rho \leq 3$ in 8-bit precision.

Given the dual subinterval range for the MPS, the subinterval corresponding to the given bin value binVal is chosen in the second step of the encoding process. If binVal is equal to the MPS value, the lower subinterval is chosen so that L is unchanged (right path of the branch in FIG. 8); otherwise, the upper subinterval with range equal to $R_{LPS}$ is selected (left branch in FIG. 8). In the third step of the regular arithmetic encoding process, the update of the probability states is performed as described above (e.g., using Equation (2)) (gray shaded boxes in FIG. 8), and finally, the fourth step consists of the renormalization of the registers L and R ("RenormE" box in FIG. 8) as described by Marpe.

The 2-D table TabRangeLPS may be defined as follows:

TabRangeLPS[64][4] =
{
  { 128, 176, 208, 240},
  { 128, 167, 197, 227},
  { 128, 158, 187, 216},
  { 123, 150, 178, 205},
  { 116, 142, 169, 195},
  { 111, 135, 160, 185},
  { 105, 128, 152, 175},
  { 100, 122, 144, 166},
  { 95, 116, 137, 158},
  { 90, 110, 130, 150},
  { 85, 104, 123, 142},
  { 81, 99, 117, 135},
  { 77, 94, 111, 128},
  { 73, 89, 105, 122},
  { 69, 85, 100, 116},
  { 66, 80, 95, 110},
  { 62, 76, 90, 104},
  { 59, 72, 86, 99},
  { 56, 69, 81, 94},
  { 53, 65, 77, 89},
  { 51, 62, 73, 85},
  { 48, 59, 69, 80},
  { 46, 56, 66, 76},
  { 43, 53, 63, 72},
  { 41, 50, 59, 69},
  { 39, 48, 56, 65},
  { 37, 45, 54, 62},
  { 35, 43, 51, 59},
  { 33, 41, 48, 56},
  { 32, 39, 46, 53},
  { 30, 37, 43, 50},
  { 29, 35, 41, 48},
  { 27, 33, 39, 45},
  { 26, 31, 37, 43},
  { 24, 30, 35, 41},
  { 23, 28, 33, 39},
  { 22, 27, 32, 37},
  { 21, 26, 30, 35},
  { 20, 24, 29, 33},
  { 19, 23, 27, 31},
  { 18, 22, 26, 30},
  { 17, 21, 25, 28},
  { 16, 20, 23, 27},
  { 15, 19, 22, 25},
  { 14, 18, 21, 24},
  { 14, 17, 20, 23},
  { 13, 16, 19, 22},
  { 12, 15, 18, 21},
  { 12, 14, 17, 20},
  { 11, 14, 16, 19},
  { 11, 13, 15, 18},
  { 10, 12, 15, 17},
  { 10, 12, 14, 16},
  { 9, 11, 13, 15},
  { 9, 11, 12, 14},
  { 8, 10, 12, 14},
  { 8, 9, 11, 13},
  { 7, 9, 11, 12}, -continued

```
        { 7, 9, 10, 12},
        { 7, 8, 10, 11},
        { 6, 8, 9, 11},
        { 6, 7, 9, 10},
        { 6, 7, 8, 9},
        { 2, 2, 2, 2}
    };
```

An example CABAC decoding process may be found in section 9.3.4.3.2.2 of the HEVC standard.

Figure 9:
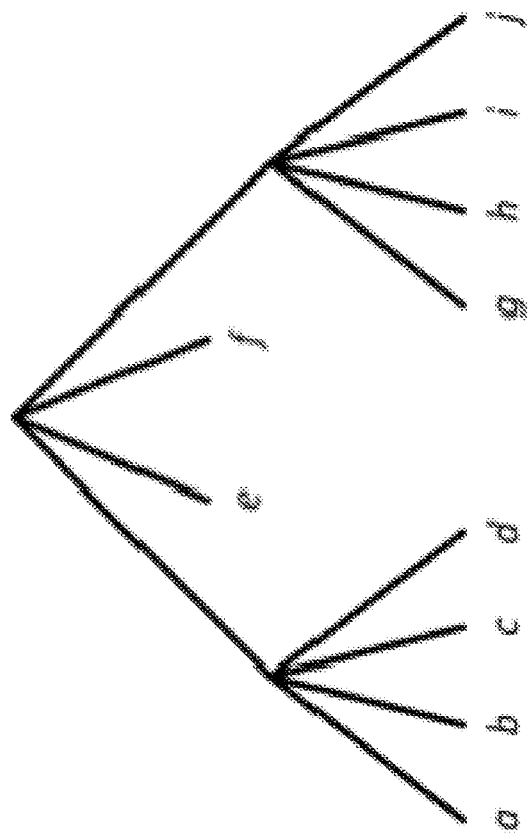
FIG. 9 is a conceptual diagram illustrating an example transform scheme based on residual quadtree.
Figure 9:
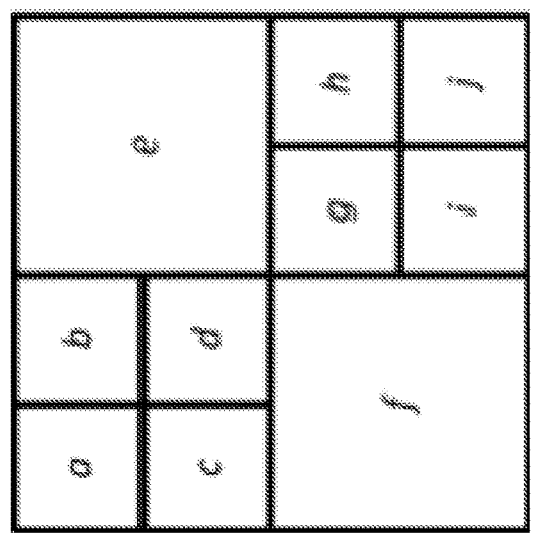

FIG. 9 is a conceptual diagram that illustrates a transform scheme based on residual quadtree. To adapt the various characteristics of the residual blocks, a transform coding structure using the residual quadtree (RQT) is applied in HEVC, which is briefly described at http://www.hhi.fraunhofer.de/departments/video-coding-analytics/research-groups/image-video-coding/hevc-high-efficiency-video-coding/transform-coding-using-the-residual-quadtree-rqt.html.

Each picture is divided into coding tree units (CTU), which are coded in raster scan order for a specific tile or slice. A CTU is a square block and represents the root of a quadtree, i.e., the coding tree. The CTU size may range from 8×8 to 64×64 luma samples, but typically 64×64 is used. Each CTU can be further split into smaller square blocks called coding units (CUs). After the CTU is split recursively into CUs, each CU is further divided into PUs and TUs. The partitioning of a CU into TUs is carried out recursively based on a quadtree approach, therefore the residual signal of each CU is coded by a tree structure namely, the residual quadtree (RQT). The RQT allows TU sizes from 4×4 up to 32×32 luma samples. FIG. 9 shows an example where a CU includes 10 TUs, labeled with the letters a to j, and the corresponding block partitioning. Each node of the RQT is actually a transform unit (TU). The individual TUs are processed in depth-first tree traversal order, which is illustrated in the figure as alphabetical order, which follows a recursive Z-scan with depth-first traversal. The quadtree approach enables the adaptation of the transform to the varying space-frequency characteristics of the residual signal. Typically, larger transform block sizes, which have larger spatial support, provide better frequency resolution. However, smaller transform block sizes, which have smaller spatial support, provide better spatial resolution. The trade-off between the two, spatial and frequency resolutions, is chosen by the encoder mode decision, for example based on rate-distortion optimization technique. The rate-distortion optimization technique calculates a weighted sum of coding bits and reconstruction distortion, i.e., the rate-distortion cost, for each coding mode (e.g., a specific RQT splitting structure), and selects the coding mode with least rate-distortion cost as the best mode.

Three parameters are defined in the RQT: the maximum depth of the tree, the minimum allowed transform size and the maximum allowed transform size. In some examples of HEVC, the minimum and maximum transform sizes can vary within the range from 4×4 to 32×32 samples, which correspond to the supported block transforms mentioned in the previous paragraph. The maximum allowed depth of the RQT restricts the number of TUs. A maximum depth equal to zero means that a CTU cannot be split any further if each included TU reaches the maximum allowed transform size, e.g., 32×32.

All these parameters interact and influence the RQT structure. Consider a case, in which the root CTU size is 64×64, the maximum depth is equal to zero and the maximum transform size is equal to 32×32. In this case, the CTU has to be partitioned at least once, since otherwise it would lead to a 64×64 TU, which is not allowed. The RQT parameters, i.e. maximum RQT depth, minimum and maximum transform size, are transmitted in the bitstream at the sequence parameter set level. Regarding the RQT depth, different values can be specified and signaled for intra and inter coded CUs.

The quadtree transform is applied for both Intra and Inter residual blocks. Typically the DCT-II transform of the same size of the current residual quadtree partition is applied for a residual block. However, if the current residual quadtree block is 4×4 and is generated by Intra prediction, the above 4×4 DST-VII transform is applied.

In HEVC, larger size transforms, e.g., 64×64 transforms, are not adopted mainly due to their limited benefit considering and relatively high complexity for relatively smaller resolution videos.

Figure 10:
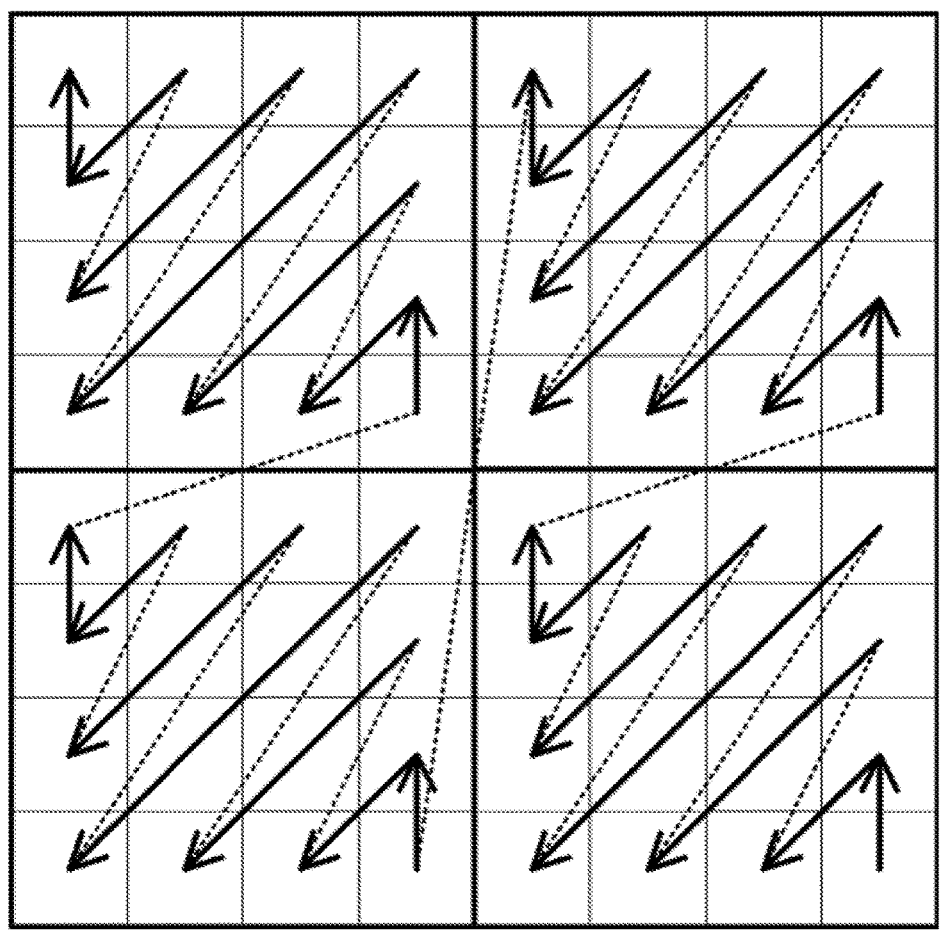
FIG. 10 is a conceptual diagram illustrating an example coefficient scan based on coefficient groups.

FIG. 10 is a conceptual diagram illustrating an example coefficient scan based on coefficient groups. Regardless the TU size, the residual of the transform unit is coded with non-overlapped coefficient groups (CG), each contains the coefficients of a 4×4 block of a TU. For example, a 32×32 TU has totally 64 CGs, and a 16×16 TU has totally 16 CGs. The CGs inside a TU may be coded according to a certain pre-defined scan order. When coding each CG, the coefficients inside the current CG are scanned and coded according to a certain pre-defined scan order for 4×4 block. FIG. 10 illustrates the coefficient scan for an 8×8 TU containing 4 CGs.

The syntax element table is defined as follows:

7.3.8.11 Residual Coding Syntax

| | Descriptor |
|---|---|
| residual_coding( x0, y0, log2TrafoSize, cIdx ) { | |
|     if( transform_skip_enabled_flag && !cu_transquant_bypass_flag && | |
|       ( log2TrafoSize = = 2 ) ) | |
|         transform_skip_flag[ x0 ][ y0 ][ cIdx ] | ae(v) |
|     last_sig_coeff_x_prefix | ae(v) |
|     last_sig_coeff_y_prefix | ae(v) |
|     if( last_sig_coeff_x_prefix > 3 ) | |
|       last_sig_coeff_x_suffix | ae(v) |
|     if( last_sig_coeff_y_prefix > 3 ) | |
|       last_sig_coeff_y_suffix | ae(v) |
|     lastScanPos = 16 | |
|     lastSubBlock = ( 1 << ( log2TrafoSize − 2 ) ) * ( 1 << ( log2TrafoSize − 2 ) ) − 1 | |
|     do { | |
|       if( lastScanPos = = 0 ) { | |
|         lastScanPos = 16 | |

|  | Descriptor |
|---|---|
| ``` 
                lastSubBlock− −
        }
        lastScanPos− −
        xS = ScanOrder[ log2TrafoSize − 2 ][ scanIdx ][ lastSubBlock ][ 0 ]
        yS = ScanOrder[ log2TrafoSize − 2 ][ scanIdx ][ lastSubBlock ][ 1 ]
        xC = ( xS << 2 ) + ScanOrder[ 2 ][ scanIdx ][ lastScanPos ][ 0 ]
        yC = ( yS << 2 ) + ScanOrder[ 2 ][ scanIdx ][ lastScanPos ][ 1 ]
    } while( ( xC != LastSignificantCoeffX ) | | ( yC != LastSignificantCoeffY
                                        ) )
    for( i = lastSubBlock; i >= 0; i− − ) {
        xS = ScanOrder[ log2TrafoSize − 2 ][ scanIdx ][ i ][ 0 ]
        yS = ScanOrder[ log2TrafoSize − 2 ][ scanIdx ][ i ][ 1 ]
        inferSbDcSigCoeffFlag = 0
        if( ( i < lastSubBlock ) && ( i > 0 ) ) {
            coded_sub_block_flag[ xS ][ yS ]
``` | ae(v) |
| ``` 
            inferSbDcSigCoeffFlag = 1
        }
        for( n = ( i = = lastSubBlock ) ? lastScanPos − 1 : 15; n >= 0; n− − ) {
            xC = ( xS << 2 ) + ScanOrder[ 2 ][ scanIdx ][ n ][ 0 ]
            yC = ( yS << 2 ) + ScanOrder[ 2 ][ scanIdx ][ n ][ 1 ]
            if( coded_sub_block_flag[ xS ][ yS ] && ( n > 0 | |
!inferSbDcSigCoeffFlag ) ) {
                sig_coeff_flag[ xC ][ yC ]
``` | ae(v) |
| ``` 
                if( sig_coeff_flag[ xC ][ yC ] )
                    inferSbDcSigCoeffFlag = 0
            }
        }
        firstSigScanPos = 16
        lastSigScanPos = −1
        numGreater1Flag = 0
        lastGreater1ScanPos = −1
        for( n = 15; n >= 0; n− − ) {
            xC = ( xS << 2 ) + ScanOrder[ 2 ][ scanIdx ][ n ][ 0 ]
            yC = ( yS << 2 ) + ScanOrder[ 2 ][ scanIdx ][ n ][ 1 ]
            if( sig_coeff_flag[ xC ][ yC ] ) {
                if( numGreater1Flag < 8 ) {
                    coeff_abs_level_greater1_flag[ n ]
``` | ae(v) |
| ``` 
                    numGreater1Flag++
                    if( coeff_abs_level_greater1_flag[ n ] && lastGreater1ScanPos
= = −1 )
                        lastGreater1ScanPos = n
                }
                if( lastSigScanPos = = −1 )
                    lastSigScanPos = n
                firstSigScanPos = n
            }
        }
        signHidden = ( lastSigScanPos − firstSigScanPos > 3 &&
!cu_transquant_bypass_flag)
        if( lastGreater1ScanPos != −1 )
            coeff_abs_level_greater2_flag[ lastGreater1ScanPos ]
``` | ae(v) |
| ``` 
        for( n = 15; n >= 0; n− − ) {
            xC = ( xS << 2 ) + ScanOrder[ 2 ][ scanIdx ][ n ][ 0 ]
            yC = ( yS << 2 ) + ScanOrder[ 2 ][ scanIdx ][ n ][ 1 ]
            if( sig_coeff_flag[ xC ][ yC ] &&
                ( !sign_data_hiding_enabled_flag | | !signHidden | | ( n !=
firstSigScanPos ) ) )
                coeff_sign_flag[ n ]
``` | ae(v) |
| ``` 
        }
        numSigCoeff = 0
        sumAbsLevel = 0
        for( n = 15; n >= 0; n− − ) {
            xC = ( xS << 2 ) + ScanOrder[ 2 ][ scanIdx ][ n ][ 0 ]
            yC = ( yS << 2 ) + ScanOrder[ 2 ][ scanIdx ][ n ][ 1 ]
            if( sig_coeff_flag[ xC ][ yC ] ) {
                baseLevel = 1 + coeff_abs_level_greater1_flag[ n ] +
                            coeff_abs_level_greater2_flag[ n ]
                if( baseLevel = = ( ( numSigCoeff < 8 ) ?
                                ( ( n = = lastGreater1ScanPos) ? 3 : 2 ) : 1 ) )
                    coeff_abs_level_remaining[ n ]
``` | ae(v) |
| ``` 
                TransCoeffLevel[ x0 ][ y0 ][ cIdx ][ xC ][ yC ] =
                    ( coeff_abs_level_remaining[ n ] + baseLevel ) * ( 1 − 2 *
coeff_sign_flag[ n ] )
                if( sign_data_hiding_enabled_flag && signHidden ) {
                    sumAbsLevel += ( coeff_abs_level_remaining[ n ] + baseLevel )
                    if( ( n = = firstSigScanPos ) && ( ( sumAbsLevel % 2 ) = = 1 ) )
                        TransCoeffLevel[ x0 ][ y0 ][ cIdx ][ xC ][ yC ] =
``` | |

-continued

| Descriptor |
|---|
| −TransCoeffLevel[ x0 ][ y0 ][ cIdx ][ xC ][ yC ] |
|         }<br>      numSigCoeff++<br>    }<br>  }<br>}<br>} |

For each color component, one flag may be firstly signaled to indicate whether current TU has at least one non-zero coefficient. If there is at least one non-zero coefficient, the position of the last significant coefficient in the coefficient scan order in a TU is then explicitly coded with a coordinate relative to the top-left corner of the transform unit. The vertical or horizontal component of the coordinate is represented by its prefix and suffix, wherein prefix is binarized with truncated rice (TR) and suffix is binarized with fixed length.

Semantics:

last_sig_coeff_x_prefix specifies the prefix of the column position of the last significant coefficient in scanning order within a transform block. The values of last_sig_coeff_x_prefix shall be in the range of 0 to (log 2TrafoSize<<1)−1, inclusive.

last_sig_coeff_y_prefix specifies the prefix of the row position of the last significant coefficient in scanning order within a transform block. The values of last_sig_coeff_y_prefix shall be in the range of 0 to (log 2TrafoSize<<1)−1, inclusive.

last_sig_coeff_x_suffix specifies the suffix of the column position of the last significant coefficient in scanning order within a transform block. The values of last_sig_coeff_x_suffix shall be in the range of 0 to (1−((last_sig_coeff_x_prefix>>1)−1))−1, inclusive.

The column position of the last significant coefficient in scanning order within a transform block LastSignificantCoeffX is derived as follows:

If last_sig_coeff_x_suffix is not present, the following applies:
LastSignificantCoeffX=last_sig_coeff_x_prefix
Otherwise (last_sig_coeff_x_suffix is present), the following applies:

LastSignificantCoeffX = ( 1 << ( (last_sig_coeff_x_prefix >> 1 ) − 1 ) ) *
    ( 2 + (last_sig_coeff_x_prefix & 1 ) ) + last_sig_coeff_x_suffix last_sig_coeff_y_suffix specifies the suffix of the row position of the last significant coefficient in scanning order within a transform block. The values of last_sig_coeff_y_suffix shall be in the range of 0 to (1−((last_sig_coeff_y_prefix>>1)−1))−1, inclusive.

The row position of the last significant coefficient in scanning order within a transform block LastSignificantCoeffY is derived as follows:

If last_sig_coeff_y_suffix is not present, the following applies:
LastSignificantCoeffY=last_sig_coeff_y_prefix
Otherwise (last_sig_coeff_y_suffix is present), the following applies:

LastSignificantCoeffY = ( 1 << ( ( last_sig_coeff_y_prefix >> 1 ) − 1 ) ) *
    ( 2 + ( last_sig_coeff_y_prefix & 1 ) ) + last_sig_coeff_y_suffix When scanIdx is equal to 2, the coordinates are swapped as follows: (LastSignificantCoeffX, LastSignificantCoeffY)=Swap(LastSignificantCoeffX, LastSignificantCoeffY)

With such a position coded and also the coefficient scanning order of the CGs, one flag is further signaled for CGs except the last CG (in scanning order) which indicates whether it contains non-zero coefficients.

Context modeling of CG flag. When coding whether one CG has non-zero coefficients, i.e., the CG flag (coded_sub_block_flag in the HEVC specification), the information of neighboring CGs are utilized to build the context. To be more specific, the context selection for coding the CG flag is defined as: (Right CG available && Flag of right CG is equal to 1)||(below CG available && Flag of below CG is equal to 1)

Here, the right and below CG are the two neighboring CGs close to current CG. For example, in FIG. 10, when coding the top-left 4×4 block, the right CG is defined as the top-right 4×4 block and the below CG is defined as the left-below 4×4 block.

Note that Chroma and luma use different sets of contexts but with the same rule to select one of them.

Details of the derivation of context index increment could be found in 9.3.4.2.4 of HEVC.

Transform coefficient coding within one CG. For those CGs that may contain non-zero coefficients, significant flags (significant flag), absolute values of coefficients (including coeff_abs_level_greater1_flag, coeff_abs_level_greater2_flag and coeff_abs_level_remaining) and sign information (coeff_sign_flag) may be further coded for each coefficient according to the pre-defined 4×4 coefficient scan order. The coding of transform coefficient levels is separated into multiple scan passes.

1) First pass of the first bin coding. In this pass, all the first bins (or the bin index 0, bin0) of transform coefficients at each position within one CG are coded except that it could be derived that the specific transform coefficient is equal to 0.

The variable sigCtx depends on the current location relative to the top-left position of current TU, the colour component index cIdx, the transform block size, and previously decoded bins of the syntax element coded_sub_block_flag. Different rules are applied depending on the TU size. Example details of the selection of the context index increment are defined in 9.3.4.2.5 of HEVC.

2) Second pass of the second bin coding. The coding of coeff_abs_level_greater1_flags is applied in this pass. The context modeling is dependent on color component index, the current sub-block scan index, and the current coefficient scan index within the current sub-block. Example details of the selection of the context index increment are defined in 9.3.4.2.6 of HEVC.

3) Third pass of the third bin coding. The coding of coeff_abs_level_greater2_flags is applied in this pass. The context modeling is similar to that used by coeff_abs_level_greater1_flags. Example details of the selection of the context index increment are defined in 9.3.4.2.7 of HEVC.

Note that in order to improve throughput, the second and third passes may not process all the coefficients in a CG. The first eight coeff_abs_level_greater1_flags in a CG are coded in regular mode. After that, the values are left to be coded in bypass mode in the fifth pass by the syntax coeff_abs_level_remaining. Similarly, only the coeff_abs_level_greater2_flags for the first coefficient in a CG with magnitude larger than 1 is coded. The rest of coefficients with magnitude larger than 1 of the CG use coeff_abs_level_remaining to code the value. This method limits the number of regular bins for coefficient levels to a maximum of 9 per CG: 8 for the coeff_abs_level_greater1_flags and 1 for coeff_abs_level_greater2_flags.

4) Fourth pass of sign information. In some examples of HEVC, the sign of each nonzero coefficient is coded in the fourth scan pass in bypass mode. For each CG, and depending on a criterion, encoding the sign of the last nonzero coefficient (in reverse scan order) is simply omitted when using sign data hidding (SDH). Instead, the sign value is embedded in the parity of the sum of the levels of the CG using a predefined convention: even corresponds to "+" and odd to "−." The criterion to use SDH is the distance in scan order between the first and the last nonzero coefficients of the CG. If this distance is equal or larger than 4, SDH is used. This value of 4 was chosen because it provides the largest gain on HEVC test sequences.

5) Last pass of remaining bins. The remaining bins are coded in a further scan pass. Let the baseLevel of a coefficient be defined as:

$$baseLevel = significant\_flag + coeff\_abs\_level\_greater1\_flag + coeff\_abs\_level\_greater2\_flag$$

Where a flag has a value of 0 or 1 and is inferred to be 0 if not present. Then, the absolute value of the coefficient is simply:

$$absCoeffLevel = baseLevel + coeff\_abs\_level\_remaining.$$

The Rice parameter is set to 0 at the beginning of each CG and it is conditionally updated depending on the previous value of the parameter and the current absolute level as follows:

if $absCoeffLevel > 3 \times 2m$, $m = \min(4, m+1)$.

The syntax element coeff_abs_level_remaining may be coded in bypass mode. In addition, some examples of HEVC employ Golomb-Rice codes for small values and switches to an Exp-Golomb code for larger values. The transition point between the codes is typically when the unary code length equals 4. The parameter update process allows the binarization to adapt to the coefficient statistics when large values are observed in the distribution.

Context modeling of inter_pred_idc. inter_pred_idc specifies whether list0, list1, or bi-prediction is used for the current prediction unit. The syntax element has up to two bins, both of which are CABAC context coded. The binairzed bin string is defined as follows:

| Value of inter_pred_idc | Bin string (nPbW + nPbH) != 12 | Bin string (nPbW + nPbH) != 12 |
|---|---|---|
| 0 | 00 | 00 |
| 1 | 01 | 01 |
| 2 | 1 | 1 | wherein nPbW and nPbH represent the current luma prediction block width and height, respectively.

For each inter-coded slice, e.g., P slice or B slice, the context selection is based on the following rule:

If (nPbW+nPbH) is unequal to 12, the first bin is coded using four contexts and the second bin is coded with one context. The context selection of the first bin is according the current CU depth. In HEVC, CU depth is in the range of 0 to 3, inclusively.

Figure 11:
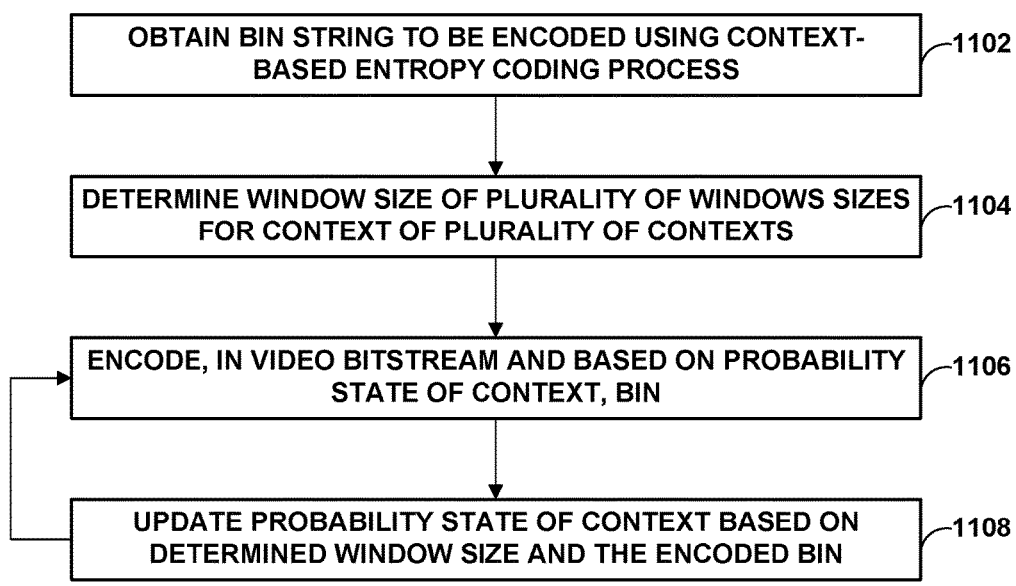
FIG. 11 is a flowchart illustrating an example process for performing context-based entropy encoding with different window sizes, in accordance with one or more techniques of this disclosure.

FIG. 11 is a flowchart illustrating an example process for performing context-based entropy encoding with different window sizes, in accordance with one or more techniques of this disclosure. The techniques of FIG. 11 may be performed by a video encoder, such as video encoder 20 illustrated in FIG. 1 and FIG. 4. For purposes of illustration, the techniques of FIG. 11 are described within the context of video encoder 20 of FIG. 1 and FIG. 4, although video encoders having configurations different than that of video encoder 20 may perform the techniques of FIG. 11.

Video encoder 20 may obtain a bin string (e.g., a one-dimensional binary vector) to be encoded using context-based entropy coding (1102). For instance, entropy encoding unit 56 of video encoder 20 may obtain the bin string by binarizing a syntax element received from prediction processing unit 42 of video encoder 20. In some examples, context-based entropy coding may comprise context-adaptive binary arithmetic coding (CABAC).

In accordance with one or more techniques of this disclosure, video encoder 20 may determine a window size of a plurality of window sizes for a context of a plurality of contexts (1104). In some examples, video encoder 20 may determine the window size based on a pre-determined window size for the context. In some examples, video encoder 20 may determine the window size by analyzing the coding efficiency of several candidate window sizes and select the candidate window size with the best coding efficiency as the window size for the context.

For instance, for each context, entropy encoding unit 56 may calculate the bits of coding a recorded bin string with different window sizes and select the one with minimum bit. In some examples, the different window sizes used by entropy encoding unit 56 may be predefined. Some example predefined window sizes are 16, 32, 64, and 128, though other window sizes are contemplated.

In some examples, entropy encoding unit 56 may encode one or more syntax elements that indicate the window size used to encode bit string. For instance, entropy encoding unit 56 may encode, in a slice header of a current slice, a first flag that indicates whether a default window size or an updated window size is used for each context. As one example, where entropy encoding unit 56 coded one or more bit strings of the current slice using a context associated with a window size other than the default window size, entropy encoding unit 56 may encode a first flag in the slice header of the current slice to indicate that one or more bit strings are of the current slice coded using a window size other than the default window size. Similarly, where entropy encoding unit 56 coded all of the bit strings of a slice using contexts associated with the default window size, entropy encoding unit 56 may encode a first flag in the slice header of the current slice to indicate that all of the bit strings of the current slice are coded using the default window size. In some examples, the first flag may be referred to as default_updating_speed_flag as described in greater detail below.

In some examples, where entropy encoding unit 56 encodes a first flag in the slice header of the current slice that indicates that one or more bit strings are of the slice coded using a window size other than the default window size, entropy encoding unit 56 may encode, in the slice header of the current slice, a second flag that indicates whether the window sizes associated with contexts used to code the current slice are inherited from a previously coded slice. In some examples, the previously coded slice may be the most recently coded slice that has one or more parameters in common with the current slice, such as the same slice type and the same initialized QP. In some examples, the first flag may be referred to as inheritance_from_previous_flag as described in greater detail below.

Syntax
7.3.6 Slice Segment Header Syntax
7.3.6.1 General Slice Segment Header Syntax

|  | Descriptor |
|---|---|
| slice_segment_header( ) { |  |
|     first_slice_segment_in_pic_flag | u(1) |
|     if( nal_unit_type >= BLA_W_LP && nal_unit_type <= RSV_IRAP_VCL23 ) |  |
|         no_output_of_prior_pics_flag | u(1) |
|     slice_pic_parameter_set_id | ue(v) |
|     ... |  |
|     if( slice_segment_header_extension_present_flag ) { |  |
|         slice_segment_header_extension_length | ue(v) |
|         for( i = 0; i < slice_segment_header_extension_length; i++) |  |
|             slice_segment_header_extension_data_byte[ i ] | u(8) |
|     } |  |
|     default_updating_speed_flag | u(1) |
|     if( !default_updating_speed) { |  |
|         inheritance_from_previous_flag | u(1) |
|         if( !inheritance_from_previous_flag ) { |  |
|             bit_map_run_length_coding ( ) |  |
|             speed_index_level_coding ( ) |  |
|         } |  |
|     } |  |
|     byte_alignment( ) |  |
| } |  |

Some example semantics for the above described syntax elements are provided below:

default_updating_speed_flag equal to 1 may specify that the default window size is used for all contexts and inheritance_from_previous_flag is not present in the slice header. default_updating_speed_flag equal to 0 may specify that inheritance_from_previous_flag is present in the slice header.

inheritance_from_previous_flag equal to 1 may specify that the window sizes associated with contexts are inherited from a previously coded slice with the same slice type and same initialized QP. inheritance_from_previous_flag equal to 0 may specify that the window sizes associated with contexts are signalled in the bitstream, bit_map_run_length_coding( ) and speed_index_level_coding are present.

In some examples, the picture to be used may be explicitly specified. If a picture contains multiple slices, either the first slice may be used or the id of the slice of that picture may be explicitly specified. In some examples, inheritance_from_previous_flag equal to 1 may specify that the window sizes associated with contexts are inherited from a previously coded slice with the same slice type.

In some examples, where entropy encoding unit 56 encodes the second flag to indicate that the window sizes associated with contexts used to code the current slice are not inherited from a previously coded slice, entropy encoding unit 56 may code one or more syntax elements to indicate the window sizes associated with contexts used to code the current slice. For instance, entropy encoding unit 56 may code a one bit map that indicate the usage of different window size, and code the new window size index when the bit indicates a new window size. In some examples, entropy encoding unit 56 may encode the one or more syntax elements to indicate the window sizes associated with contexts used to code the current slice as described below.

7.xxxx Bit Map Run Length Coding Syntax

|  | Descriptor |
|---|---|
| bit_map_run_length_coding ( ) { |  |
|     run = 0 |  |
|     ctxIdx = 0 |  |

-continued

|  | Descriptor |
|---|---|
|     while ( ctxIdx < totalCtxNr ) { |  |
|         run[ i ] | ue(v) |
|         ctxIdx += run[ i ] |  |
|         if( ctxIdx >= totalCtxNr ) { |  |
|             break; |  |
|         } |  |
|         ctxUpdatedSpeedFlag[ ctxIdx ] = 1 |  |
|         ctxIdx ++ |  |
|     } |  |
| } |  |

Alternatively, the following table may be defined:

| | Descriptor |
|---|---|
| bit_map_run_length_coding ( ) {<br>    run = 0<br>    ctxIdx = 0<br>    while ( ctxIdx < totalCtxNr ) {<br>        run[ i ]<br>        ctxIdx += run[ i ]<br>        ctxUpdatedSpeedFlag[ ctxIdx ] = 1<br>        ctxIdx ++<br>    }<br>} | <br><br><br><br>ue(v) |

7.xxxx Speed Index Level Coding Syntax

| | Descriptor |
|---|---|
| speed_index_level_coding ( ) {<br>    for ( i = 0; i < totalCtxNr; i ++ ) {<br>        if ( ctxUpdatedSpeedFlag[ i ] ) {<br>            ctx_idx_difference[ i ]<br>        }<br>    }<br>} | <br><br><br>ue(v) |

Some example semantics for the above described syntax elements are provided below:

run[i] may indicate the number of consecutive contexts that use the default updating speed.

ctxUpdatedSpeedFlag may be an array with totalCtxNr entries. For each entry, it may be set to be 0 before decoding one slice which indicates that each context uses the default probability updating speed, i.e., the default window size. In one example, the default window size is equal to 64.

In one example, totalCtxNr may represent the total number of contexts that may be used in current slice. In another example, totalCtxNr may represent the total number of contexts that may be used in all slices. In another example, totalCtxNr may represent the total number of selected contexts that are pre-defined.

ctx_idx_difference may indicate the difference of indices of window size compared to the default window size.

In one example, the default window size may be equal to 64. In some examples, such as when ctx_idx_difference is equal to 2, window size may be set to 128. In some examples, such as when ctx_idx_difference is equal to 0 or 1, window size may be set equal to (1<<(ctx_idx_difference+4)). That is, four window sizes may be supported, i.e., 16, 32, 64, and 128, though examples with additional or fewer windows sizes are contemplated. In some examples, entropy encoding unit 56 may signal some or all of the above information in an active parameter set.

At the decoder side, for each slice header, a first flag may be firstly decoded which may indicate the usage of default window size or updated window sizes for each context. In some examples, if the first flag is equal to 1 (i.e., using updated window sizes), a second flag may be further decoded which may indicate the inheritance from a previously coded picture or the additional signaling of updated window sizes. If the signaling of window sizes is needed, a bit map may be firstly signaled to indicate the usage of different window sizes, and signal the new window size index when the bit indicates a new window size.

In any case, video encoder 20 may encode, in a video bitstream and based on a probability state of the context, a bin of the bin string (1106). For instance, entropy encoding unit 56 may output a binary stream that represents a value or pointer to a probability within a final coded probability interval of the context.

Video encoder 20 may update a probability state of the context model based on the determined window size (1108). For instance, given a determined window size $W_i$ associated with an i-th context model, entropy encoding unit 56 may update the probability state of the i-th context model in accordance with Equation (15), below, where k may represent the precision of probabilities. In one example, k is equal to 15.

$$P_{new} = \begin{cases} (2^k/W_i) + P_{old} - (P_{old}/W_i) & MPS \text{ (e.g., 1)} \\ P_{old} - (P_{old}/W_i) & LPS \text{ (e.g., } (1-MPS)) \end{cases} \quad (15)$$

When $W_i$ is equal to $(1<<M_i)$, the probability updating process performed by entropy encoding unit 56 could be rewritten as shown in Equation (16), below $$P_{new} = \begin{cases} P_{old} + ((2^k - P_{old}) >> M_i) & MPS \text{ (e.g., 1)} \\ P_{old} - (P_{old} >> M_i) & LPS \text{ (e.g., } (1-MPS)) \end{cases} \quad (16)$$

Video encoder 20 may encode, in the video bitstream and based on the updated probability state of the context, another bin (1106). In some examples, the other bin encoded may be a second bin of the bin string.

Figure 12:
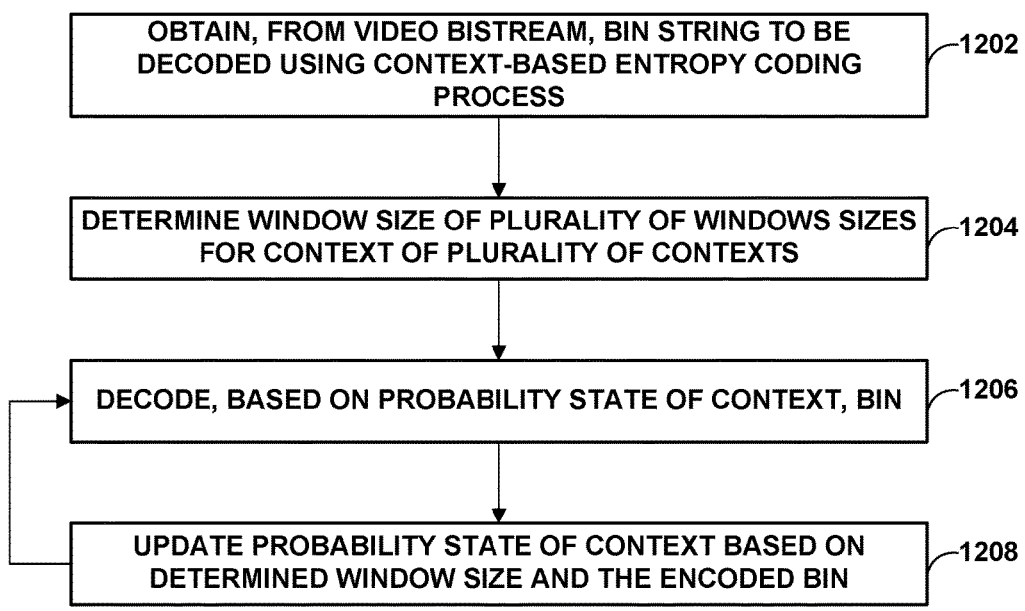
FIG. 12 is a flowchart illustrating an example process for performing context-based entropy decoding with different window sizes, in accordance with one or more techniques of this disclosure.

FIG. 12 is a flowchart illustrating an example process for performing context-based entropy decoding with different window sizes, in accordance with one or more techniques of this disclosure. The techniques of FIG. 12 may be performed by a video decoder, such as video decoder 30 illustrated in FIG. 1 and FIG. 6. For purposes of illustration, the techniques of FIG. 12 are described within the context of video decoder 30 of FIG. 1 and FIG. 6, although video decoders having configurations different than that of video decoder 30 may perform the techniques of FIG. 12.

Video decoder 30 may obtain, from a video bitstream, a bin string (e.g., a one-dimensional binary vector) to be decoded using context-based entropy coding (1202). For instance, entropy decoding unit 70 of video decoder 30 may obtain, from video data memory 69, the bin string. In some examples, context-based entropy coding may comprise context-adaptive binary arithmetic coding (CABAC).

In accordance with one or more techniques of this disclosure, video decoder 30 may determine a window size of a plurality of window sizes for a context of a plurality of contexts (1204). In some examples, video decoder 30 may determine the window size based on a pre-determined window size for the context. In some examples, video decoder 30 may determine the window size by analyzing the coding efficiency of several candidate window sizes and select the candidate window size with the best coding efficiency as the window size for the context.

In some examples, entropy decoding unit 70 may encode one or more syntax elements that indicate the window size used to encode bit string. For instance, entropy decoding unit 70 may decode, from a slice header of a current slice, a first flag that indicates whether a default window size or an updated window size is used for each context. As one example, where entropy decoding unit 70 decoded one or more bit strings of the current slice using a context associated with a window size other than the default window size, entropy decoding unit 70 may decode a first flag from the slice header of the current slice that indicates that one or more bit strings are of the current slice coded using a window size other than the default window size. Similarly, where entropy decoding unit 70 decoded all of the bit strings of a slice using contexts associated with the default window size, entropy decoding unit 70 may decode a first flag from the slice header of the current slice that indicates that all of the bit strings of the current slice are coded using the default window size. In some examples, the first flag may be referred to as default_updating_speed_flag as described in greater detail above.

In some examples, where entropy encoding unit 56 encodes a first flag in the slice header of the current slice that indicates that one or more bit strings are of the slice coded using a window size other than the default window size, entropy encoding unit 56 may encode, in the slice header of the current slice, a second flag that indicates whether the window sizes associated with contexts used to code the current slice are inherited from a previously coded slice. In some examples, the previously coded slice may be the most recently coded slice that has one or more parameters in common with the current slice, such as the same slice type and the same initialized QP. In some examples, the first flag may be referred to as inheritance_from_previous_flag as described in greater detail above with reference to FIG. 11.

In some examples, the picture to be used may be explicitly specified. If a picture contains multiple slices, either the first slice may be used or the id of the slice of that picture may be explicitly specified. In some examples, inheritance_from_previous_flag equal to 1 may specify that the window sizes associated with contexts are inherited from a previously coded slice with the same slice type.

In some examples, where the second flag indicates that the window sizes associated with contexts used to code the current slice are not inherited from a previously coded slice, entropy decoding unit 70 may decode one or more syntax elements that indicate the window sizes associated with contexts used to code the current slice. For instance, entropy decoding unit 70 may decode a one bit map that indicate the usage of different window size, and decode the new window size index when the bit indicates a new window size. In some examples, entropy decoding unit 70 may decode the one or more syntax elements to indicate the window sizes associated with contexts used to code the current slice as described above with reference to FIG. 11.

In any case, video decoder 30 may decode, based on a probability state of the context, a bin of the bin string (1206). Video decoder 30 may update a probability state of the context model based on the determined window size and the decoded bin (1208). For instance, given a determined window size $W_i$ associated with an i-th context model, entropy decoding unit 70 may update the probability state of the i-th context model in accordance with Equation (15), above.

Video decoder 30 may decode, based on the updated probability state of the context, another bin (1206). In some examples, the other bin encoded may be a second bin of the bin string.

The following numbered examples may illustrate one or more aspects of the disclosure:

EXAMPLE 1

A method for entropy coding of video data, the method comprising: determining a window size of a plurality of window sizes for a context of a plurality of contexts used in a context-adaptive entropy coding process to entropy code a value for a syntax element of the video data; entropy coding, based on a probability state of the context, a bin of the value for the syntax element; and updating the probability state of the context based on the window size and the coded bin.

EXAMPLE 2

The method of claim 1, wherein a context-adaptive entropy coding process comprises a context-adaptive binary arithmetic coding (CABAC) process, or a context-adaptive variable length coding (CAVLC) process.

EXAMPLE 3

The method of claim 1, further comprising: entropy coding another bin associated with the same context based on the updated probability state.

EXAMPLE 4

The method of claim 1, wherein the context is a first context, the method further comprising: determining a window size of the plurality of window sizes for a second context of the plurality of contexts, wherein the window size of the second context is different than the window size of the first context.

EXAMPLE 5

The method of claim 4, wherein the window size for the first context and the window size for the second context are not signaled in a bitstream that includes the coded bin.

EXAMPLE 6

The method of claim 1, wherein the plurality of window sizes comprises a pre-defined set of window sizes.

EXAMPLE 7

The method of claim 6, wherein entropy coding comprises entropy encoding, and wherein determining the window size comprises: determining, for respective window sizes of the pre-defined set of window sizes, respective quantities of bits used to entropy encode a particular bin string that includes the bin values for the syntax element; and selecting the window size of the pre-defined set of window sizes that corresponds to the smallest quantity of bits as the window size for the context to entropy encode the particular bin string.

EXAMPLE 8

The method of claim 1, further comprising: coding a first syntax element that indicates whether a default window size is used for the plurality of contexts.

EXAMPLE 9

The method of claim 8, further comprising: based on the first syntax element indicating that the default window size is not used for the plurality of contexts, coding a second syntax element that indicates the window size for the context.

EXAMPLE 10

The method of claim 9, wherein to indicate the window size for the context, the second syntax element indicates a difference between the window size for the context and the default window size.

EXAMPLE 11

The method of claim 8, wherein coding the first syntax element comprises coding a slice header of a current slice including the first syntax element, wherein the first syntax element indicates whether the default window size is used for the plurality of contexts when entropy coding bins of the current slice.

EXAMPLE 12

The method of claim 1, further comprising: coding, in a slice header of a current slice, a syntax element that indicates whether window sizes for the plurality of contexts are inherited from a previously coded slice.

EXAMPLE 13

The method of claim 1, wherein determining the window size for the context comprises: determining the window size for the context based on a type of the syntax element.

EXAMPLE 14

The method of claim 1, wherein entropy coding comprises entropy decoding, the method further comprising: decoding, from a coded video bitstream, one or more syntax elements that indicate the window size for the context.

EXAMPLE 15

An apparatus for entropy coding of video data, the apparatus comprising: a memory configured to store a plurality of contexts used in a context-adaptive entropy coding process to entropy code a value for a syntax element of the video data; and one or more processors configured to: perform the method of any combination of examples 1-14.

EXAMPLE 16

The apparatus of example 15, wherein the apparatus comprises at least one of: an integrated circuit; a microprocessor; or a wireless communication device.

EXAMPLE 17

The apparatus of any combination of examples 15-16, further comprising a display configured to display decoded video data.

EXAMPLE 18

The apparatus of any combination of examples 15-17, further comprising a camera configured to capture the video data.

EXAMPLE 19

An apparatus for entropy coding of video data, the apparatus comprising: means for performing the method of any combination of examples 1-14.

EXAMPLE 20

A computer-readable storage medium storing instructions that, when executed, cause one or more processors of a video coding device to perform the method of any combination of examples 1-14.

EXAMPLE 21

A computer-readable storage medium storing video data that, when processed by a video decoding device, cause one or more processors of the video decoding device to determine a window size of a plurality of window sizes for a context of a plurality of contexts used in a context-adaptive coding process to entropy code a value for a syntax element; entropy code, based on a probability state of the context, a bin of the value for the syntax element; update the probability state of the context based on the window size and the coded bin; and entropy code a next bin with the same context based on the updated probability state of the context model.

EXAMPLE 22

The computer-readable storage medium of example 21, further storing instructions that cause the one or more processors to perform the method of any combination of examples 1-14.

In one or more examples, the functions described may be implemented in hardware, software, firmware, or any combination thereof. If implemented in software, the functions may be stored on or transmitted over, as one or more instructions or code, a computer-readable medium and executed by a hardware-based processing unit. Computer-readable media may include computer-readable storage media, which corresponds to a tangible medium such as data storage media, or communication media including any medium that facilitates transfer of a computer program from one place to another, e.g., according to a communication protocol. In this manner, computer-readable media generally may correspond to (1) tangible computer-readable storage media which is non-transitory or (2) a communication medium such as a signal or carrier wave. Data storage media may be any available media that can be accessed by one or more computers or one or more processors to retrieve instructions, code and/or data structures for implementation of the techniques described in this disclosure. A computer program product may include a computer-readable medium.

By way of example, and not limitation, such computer-readable storage media can comprise RAM, ROM, EEPROM, CD-ROM or other optical disk storage, magnetic disk storage, or other magnetic storage devices, flash memory, or any other medium that can be used to store desired program code in the form of instructions or data structures and that can be accessed by a computer. Also, any connection is properly termed a computer-readable medium. For example, if instructions are transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, DSL, or wireless technologies such as infrared, radio, and microwave are included in the definition of medium. It should be understood, however, that computer-readable storage media and data storage media do not include connections, carrier waves, signals, or other transient media, but are instead directed to non-transient, tangible storage media. Disk and disc, as used herein, includes compact disc (CD), laser disc, optical disc, digital versatile disc (DVD), floppy disk and Blu-ray disc, where disks usually reproduce data magnetically, while discs reproduce data optically with lasers. Combinations of the above should also be included within the scope of computer-readable media.

Instructions may be executed by one or more processors, such as one or more digital signal processors (DSPs), general purpose microprocessors, application specific integrated circuits (ASICs), field programmable logic arrays (FPGAs), or other equivalent integrated or discrete logic circuitry. Accordingly, the term "processor," as used herein may refer to any of the foregoing structure or any other structure suitable for implementation of the techniques described herein. In addition, in some aspects, the functionality described herein may be provided within dedicated hardware and/or software modules configured for encoding and decoding, or incorporated in a combined codec. Also, the techniques could be fully implemented in one or more circuits or logic elements.

The techniques of this disclosure may be implemented in a wide variety of devices or apparatuses, including a wireless handset, an integrated circuit (IC) or a set of ICs (e.g., a chip set). Various components, modules, or units are described in this disclosure to emphasize functional aspects of devices configured to perform the disclosed techniques, but do not necessarily require realization by different hardware units. Rather, as described above, various units may be combined in a codec hardware unit or provided by a collection of interoperative hardware units, including one or more processors as described above, in conjunction with suitable software and/or firmware.

Various examples have been described. These and other examples are within the scope of the following claims.

What is claimed is:

1. A method for entropy coding of video data, the method comprising:
   determining a window size of a plurality of window sizes for a first context of a plurality of contexts used in a context-adaptive binary arithmetic coding (CABAC) process;
   CABAC coding, based on a probability state of the first context, a bin of a value for a first syntax element of the video data;
   updating the probability state of the first context based on the window size for the first context and the coded bin of the value for the first syntax element;
   determining a window size of the plurality of window sizes for a second context of the plurality of contexts, wherein the window size for the second context is different than the window size for the first context, and wherein the window size for the second context is not used to update the probability state of the first context;
   CABAC coding, based on a probability state of the second context, a bin of a value for a second syntax element of the video data; and
   updating the probability state of the second context based on the window size for the second context and the coded bin for the second syntax element.

2. The method of claim 1, further comprising:
   CABAC coding another bin associated with the first context based on the updated probability state of the first context.

3. The method of claim 1, wherein the window size for the first context and the window size for the second context are not signaled in a bitstream that includes the coded bin.

4. The method of claim 1, wherein the plurality of window sizes comprises a pre-defined set of window sizes.

5. The method of claim 4, wherein CABAC coding comprises CABAC encoding, and wherein determining the window size comprises:
   determining, for respective window sizes of the pre-defined set of window sizes, respective quantities of bits used to CABAC encode a particular bin string that includes the bin values for the syntax element; and
   selecting the window size of the pre-defined set of window sizes that corresponds to the smallest quantity of bits as the window size for the first context to CABAC encode the particular bin string.

6. The method of claim 1, further comprising:
   coding a first syntax element that indicates whether a default window size is used for the plurality of contexts.

7. The method of claim 6, further comprising:
   based on the first syntax element indicating that the default window size is not used for the plurality of contexts, coding a second syntax element that indicates the window size for the first context.

8. The method of claim 7, wherein to indicate the window size for the first context, the second syntax element indicates a difference between the window size for the first context and the default window size.

9. The method of claim 6, wherein coding the first syntax element comprises coding a slice header of a current slice including the first syntax element, wherein the first syntax element indicates whether the default window size is used for the plurality of contexts when CABAC coding bins of the current slice.

10. The method of claim 1, further comprising:
    coding, in a slice header of a current slice, a syntax element that indicates whether window sizes for the plurality of contexts are inherited from a previously coded slice.

11. The method of claim 1, wherein determining the window size for the first context comprises:
    determining the window size for the first context based on a type of the first syntax element.

12. The method of claim 1, wherein CABAC coding comprises CABAC decoding, the method further comprising:
    decoding, from a coded video bitstream, one or more syntax elements that indicate the window size for the first context.

13. An apparatus for entropy coding of video data, the apparatus comprising:
    a memory configured to store a plurality of contexts used in a context-adaptive entropy binary arithmetic (CABAC) process; and
    one or more processors configured to:
        determine a window size of a plurality of window sizes for a first context of the plurality of contexts;
        CABAC code, based on a probability state of the first context, a bin of a value for a first syntax element of the video data;

update the probability state of the first context based on the window size for the first context the coded bin of the value for the first syntax element;

determine a window size of the plurality of window sizes for a second context of the plurality of contexts, wherein the window size for the second context is different than the window size for the first context, and wherein the window size for the second context is not used to update the probability state of the first context;

CABAC code, based on a probability state of the second context, a bin of a value for a second syntax element of the video data; and update the probability state of the second context based on the window size for the second context and the coded bin for the second syntax element.

14. The apparatus of claim 13, wherein the one or more processors are further configured to:

CABAC code another bin associated with the first context based on the updated probability state of the first context.

15. The apparatus of claim 13, wherein the window size for the first context and the window size for the second context are not signaled in a bitstream that includes the coded bin.

16. The apparatus of claim 14, wherein the plurality of window sizes comprises a pre-defined set of window sizes.

17. The apparatus of claim 16, wherein, to CABAC code, the one or more processors are configured to CABAC encode, and wherein, to determine the window size, the one or more processors are configured to:

determine, for respective window sizes of the pre-defined set of window sizes, respective quantities of bits used to CABAC encode a particular bin string that includes the bin value for the syntax element; and select the window size of the pre-defined set of window sizes that corresponds to the smallest quantity of bits as the window size for the first context to CABAC encode the particular bin string.

18. The apparatus of claim 13, wherein the one or more processors are further configured to:

code a first syntax element that indicates whether a default window size is used for the plurality of contexts.

19. The apparatus of claim 18, wherein, based on the first syntax element indicating that the default window size is not used for the plurality of contexts, the one or more processors are further configured to:

code a second syntax element that indicates the window size for the first context.

20. The apparatus of claim 19, wherein to indicate the window size for the first context, the second syntax element indicates a difference between the window size for the first context and the default window size.

21. The apparatus of claim 18, wherein, to code the first syntax element, the one or more processors are configured to code a slice header of a current slice including the first syntax element, wherein the first syntax element indicates whether the default window size is used for the plurality of context models when CABAC coding bins of the current slice.

22. The apparatus of claim 13, wherein the one or more processors are further configured to:

code, in a slice header of a current slice, a syntax element that indicates whether window sizes for the plurality of contexts are inherited from a previously coded slice.

23. The apparatus of claim 13, wherein, to determine the window size for the first context, the one or more processors are configured to:

determine the window size for the first context based on a type of the first syntax element.

24. The apparatus of claim 13, wherein the apparatus comprises at least one of:

an integrated circuit;
a microprocessor; or
a wireless communication device.

25. The apparatus of claim 24, further comprising a display configured to display decoded video data.

26. The apparatus of claim 24, further comprising a camera configured to capture the video data.

27. The apparatus of claim 13, wherein, to CABAC code, the one or more processors are configured to CABAC decode the value of the syntax element.

28. An apparatus for entropy coding of video data, the apparatus comprising:

means for determining a window size of a plurality of window sizes for a first context of a plurality of contexts used in a context-adaptive binary arithmetic coding (CABAC) process;

means for CABAC coding, based on a probability state of the first context, a bin of a value for a first syntax element of the video data;

means for updating the probability state of the first context based on the window size for the first context and the coded bin of the value for the first syntax element;

means for determining a window size of the plurality of window sizes for a second context of the plurality of contexts, wherein the window size for the second context is different than the window size for the first context, and wherein the window size for the second context is not used to update the probability state of the first context;

means for CABAC coding, based on a probability state of the second context, a bin of a value for a second syntax element of the video data; and means for updating the probability state of the second context based on the window size for the second context and the coded bin for the second syntax element.

29. A non-transitory computer-readable storage medium storing instructions that, when executed, cause one or more processors of a video coding device to:

determine a window size of a plurality of window sizes for a first context of a plurality of contexts used in a context-adaptive binary arithmetic coding (CABAC) process;

CABAC code, based on a probability state of the first context, a bin of a value for a first syntax element of the video data;

update the probability state of the first context based on the window size for the first context and the coded bin of the value for the first syntax element;

determine a window size of the plurality of window sizes for a second context of the plurality of contexts, wherein the window size for the second context of the plurality of contexts is different than the window size for the first context, and wherein the window size for the second context is not used to update the probability state of the first context;

CABAC code, based on a probability state of the second context, a bin of a value for a second syntax element of the video data; and update the probability state of the second context based on the window size of the second context and the coded bin for the second syntax element.

* * * * *